United States Patent
Bellman et al.

(10) Patent No.: US 9,889,635 B2
(45) Date of Patent: Feb. 13, 2018

(54) FACILITATED PROCESSING FOR CONTROLLING BONDING BETWEEN SHEET AND CARRIER

(71) Applicant: Corning Incorporated, Corning, NY (US)

(72) Inventors: Robert Alan Bellman, Painted Post, NY (US); Dana Craig Bookbinder, Corning, NY (US); Robert George Manley, Vestal, NY (US); Prantik Mazumder, Ithaca, NY (US)

(73) Assignee: Corning Incorporated, Corning, NY (US)

(*) Notice: Subject to any disclaimer, the term of this patent is extended or adjusted under 35 U.S.C. 154(b) by 142 days.

(21) Appl. No.: 14/651,720

(22) PCT Filed: Dec. 13, 2013

(86) PCT No.: PCT/US2013/074859
§ 371 (c)(1),
(2) Date: Jun. 12, 2015

(87) PCT Pub. No.: WO2014/093740
PCT Pub. Date: Jun. 19, 2014

(65) Prior Publication Data
US 2015/0306847 A1 Oct. 29, 2015

Related U.S. Application Data

(60) Provisional application No. 61/736,880, filed on Dec. 13, 2012.

(51) Int. Cl.
*B32B 17/06* (2006.01)
*H01L 51/00* (2006.01)
(Continued)

(52) U.S. Cl.
CPC ............ *B32B 17/06* (2013.01); *B32B 3/04* (2013.01); *B32B 7/12* (2013.01); *C03C 27/10* (2013.01);
(Continued)

(58) Field of Classification Search
CPC .............................................. C03C 2218/328
(Continued)

(56) References Cited

U.S. PATENT DOCUMENTS 3,722,181 A 3/1973 Kirkland et al.
4,179,324 A 12/1979 Kirkpartrick
(Continued)

FOREIGN PATENT DOCUMENTS

CN 101924067 A 12/2010
CN 102070120 B 9/2012
(Continued)

OTHER PUBLICATIONS

Girifalco and Good, A Theory for the Estimation of Surface and Interfacial Energies. I. Derivation and Application to Interfacial Tension, H. Phys. Chem., vol. 61, Jul. 1957, pp. 904-909.
(Continued)

*Primary Examiner* — Brent O'Hern
(74) *Attorney, Agent, or Firm* — Jeffrey A. Schmidt

(57) ABSTRACT

A method of forming an article from a glass sheet (20) having a glass-sheet bonding surface (24) and a glass carrier (10) having a carrier bonding surface (14). At least one of the glass sheet and carrier bonding surfaces is coated with a surface modification layer (30), and then the glass sheet is connected with the carrier via the surface modification layer. From the perimeter of the glass sheet and the carrier while connected, there is removed a portion of the surface modification layer so as to expose a portion (19, 29) of the bonding surface on each of the glass sheet and the carrier.
(Continued)

The glass sheet and carrier are then heated at a temperature ≥400° C. so as to bond the perimeter of the glass sheet (26) with the perimeter of the carrier (16).

12 Claims, 5 Drawing Sheets

(51) Int. Cl.
  *B32B 3/04* (2006.01)
  *B32B 7/12* (2006.01)
  *C03C 27/10* (2006.01)

(52) U.S. Cl.
  CPC ...... *H01L 51/0096* (2013.01); *B32B 2255/26* (2013.01); *B32B 2457/206* (2013.01); *B32B 2457/208* (2013.01); *C03C 2218/328* (2013.01); *Y02E 10/549* (2013.01)

(58) Field of Classification Search
  USPC .......................................................... 428/57
  See application file for complete search history.

(56) References Cited

U.S. PATENT DOCUMENTS

| | | |
|---|---|---|
| 4,397,722 A | 8/1983 | Haller |
| 4,599,243 A | 7/1986 | Sachdev et al. |
| 4,822,466 A | 4/1989 | Rabalais et al. |
| 4,849,284 A | 7/1989 | Arthur et al. |
| 4,990,462 A | 2/1991 | Sliwa, Jr. |
| 5,073,181 A | 12/1991 | Foster et al. |
| 5,141,800 A | 8/1992 | Effenberger et al. |
| 5,357,726 A | 10/1994 | Effenberger et al. |
| 5,413,940 A | 5/1995 | Lin et al. |
| 5,479,043 A | 12/1995 | Nuyen |
| 5,482,896 A | 1/1996 | Tang |
| 5,554,680 A | 9/1996 | Ojakaar |
| 5,616,179 A | 4/1997 | Baldwin et al. |
| 5,661,618 A | 8/1997 | Brown et al. |
| 5,820,991 A | 10/1998 | Cabo |
| 5,840,616 A | 11/1998 | Sakaguchi et al. |
| 5,888,591 A | 3/1999 | Gleason et al. |
| 5,904,791 A | 5/1999 | Bearinger et al. |
| 5,966,622 A | 10/1999 | Levine et al. |
| 5,972,152 A | 10/1999 | Lake et al. |
| 6,037,026 A | 3/2000 | Iwamoto |
| 6,091,478 A | 7/2000 | Tanaka et al. |
| 6,124,154 A | 9/2000 | Miyasaka |
| 6,159,385 A | 12/2000 | Yao et al. |
| 6,261,398 B1 | 7/2001 | Costa |
| 6,338,901 B1 | 1/2002 | Veerasamy |
| 6,387,736 B1 | 5/2002 | Cao et al. |
| 6,521,511 B1 | 2/2003 | Inoue et al. |
| 6,521,857 B1 | 2/2003 | Barnett |
| 6,528,145 B1 | 3/2003 | Berger et al. |
| 6,540,866 B1 | 4/2003 | Zhang et al. |
| 6,602,606 B1 * | 8/2003 | Fujisawa ......... H01L 31/022466 136/243 |
| 6,645,828 B1 | 11/2003 | Farrens et al. |
| 6,687,969 B1 | 2/2004 | Dando |
| 6,699,798 B2 | 3/2004 | Rockford |
| 6,735,982 B2 | 5/2004 | Matthies |
| 6,762,074 B1 | 7/2004 | Draney et al. |
| 6,814,833 B2 | 11/2004 | Sabia |
| 6,815,070 B1 | 11/2004 | Burkle et al. |
| 6,974,731 B2 | 12/2005 | Yamazaki et al. |
| 6,992,371 B2 | 1/2006 | Mancini et al. |
| 7,041,608 B2 | 5/2006 | Sieber et al. |
| 7,045,878 B2 | 5/2006 | Faris |
| 7,056,751 B2 | 6/2006 | Faris |
| 7,060,323 B2 | 6/2006 | Sughara et al. |
| 7,147,740 B2 | 12/2006 | Kho et al. |
| 7,166,520 B1 | 1/2007 | Henley |
| 7,220,656 B2 | 5/2007 | Forbes |
| 7,232,739 B2 | 6/2007 | Kerdiles et al. |
| 7,261,793 B2 | 8/2007 | Chen et al. |
| 7,351,300 B2 | 4/2008 | Takayama et al. |
| 7,364,942 B2 | 4/2008 | Martin |
| 7,466,390 B2 | 12/2008 | French et al. |
| 7,482,249 B2 | 1/2009 | Jakob et al. |
| 7,574,787 B2 | 8/2009 | Wu et al. |
| 7,635,617 B2 | 12/2009 | Yamazaki |
| 7,737,035 B1 | 6/2010 | Lind et al. |
| 7,842,548 B2 | 11/2010 | Lee et al. |
| 7,902,038 B2 | 3/2011 | Aspar et al. |
| 7,960,840 B2 | 6/2011 | Bonifield et al. |
| 7,978,282 B2 | 7/2011 | An et al. |
| 7,989,314 B2 | 8/2011 | Lee et al. |
| 8,012,667 B2 | 9/2011 | Nam et al. |
| 8,034,206 B2 | 10/2011 | Kim et al. |
| 8,034,452 B2 | 10/2011 | Padiyath et al. |
| 8,048,794 B2 | 11/2011 | Knickerbocker |
| 8,173,249 B2 | 5/2012 | Leu et al. |
| 8,211,259 B2 | 7/2012 | Sato et al. |
| 8,236,669 B2 | 8/2012 | Hong et al. |
| 8,268,939 B2 | 9/2012 | Ebbrecht et al. |
| 8,349,727 B2 | 1/2013 | Guo et al. |
| 8,383,460 B1 | 2/2013 | Yim |
| 8,590,688 B2 | 11/2013 | Weigl |
| 8,609,229 B2 | 12/2013 | Kondo |
| 8,656,735 B2 | 2/2014 | Tamitsuji et al. |
| 8,993,706 B2 | 3/2015 | Schubert et al. |
| 9,131,587 B2 | 9/2015 | Zhou |
| 9,269,826 B2 | 2/2016 | Hosono et al. |
| 9,612,455 B2 | 4/2017 | Nicolson et al. |
| 2002/0171080 A1 | 11/2002 | Faris |
| 2003/0017303 A1 | 1/2003 | Shindo et al. |
| 2003/0020062 A1 | 1/2003 | Faris |
| 2003/0057563 A1 | 3/2003 | Nathan et al. |
| 2003/0175525 A1 | 9/2003 | Wochnowski et al. |
| 2003/0228413 A1 | 12/2003 | Ohta et al. |
| 2004/0217352 A1 | 11/2004 | Forbes |
| 2004/0222500 A1 | 11/2004 | Aspar et al. |
| 2004/0247949 A1 | 12/2004 | Akedo et al. |
| 2004/0258850 A1 | 12/2004 | Straccia et al. |
| 2005/0001201 A1 | 1/2005 | Bocko et al. |
| 2005/0029224 A1 | 2/2005 | Aspar et al. |
| 2005/0059218 A1 | 3/2005 | Faris |
| 2005/0069713 A1 | 3/2005 | Gupta et al. |
| 2005/0081993 A1 | 4/2005 | Ilkka et al. |
| 2005/0118742 A1 | 6/2005 | Henning et al. |
| 2005/0175851 A1 | 8/2005 | Bordunov et al. |
| 2005/0224155 A1 | 10/2005 | Chen et al. |
| 2005/0242341 A1 | 11/2005 | Knudson et al. |
| 2006/0134362 A1 | 6/2006 | Lu et al. |
| 2006/0246218 A1 | 11/2006 | Bienkiewicz et al. |
| 2006/0250559 A1 | 11/2006 | Bocko et al. |
| 2006/0264004 A1 | 11/2006 | Tong et al. |
| 2007/0077353 A1 | 4/2007 | Lee et al. |
| 2007/0077728 A1 | 4/2007 | Kulkarni et al. |
| 2007/0077782 A1 | 4/2007 | Lee et al. |
| 2007/0105252 A1 | 5/2007 | Lee et al. |
| 2007/0105339 A1 | 5/2007 | Faris |
| 2007/0111391 A1 | 5/2007 | Aoki et al. |
| 2007/0134784 A1 | 7/2007 | Halverson et al. |
| 2007/0181938 A1 | 8/2007 | Bucher et al. |
| 2008/0044588 A1 | 2/2008 | Sakhrani |
| 2008/0053959 A1 | 3/2008 | Tong et al. |
| 2008/0135175 A1 | 6/2008 | Higuchi |
| 2008/0173992 A1 | 7/2008 | Mahler et al. |
| 2009/0091025 A1 | 4/2009 | Wong et al. |
| 2009/0110882 A1 | 4/2009 | Higuchi |
| 2009/0126404 A1 | 5/2009 | Sakhrani et al. |
| 2009/0133820 A1 | 5/2009 | Sato et al. |
| 2009/0261062 A1 | 10/2009 | Kim |
| 2009/0262294 A9 | 10/2009 | Templier et al. |
| 2009/0321005 A1 | 12/2009 | Higuchi et al. |
| 2010/0038023 A1 | 2/2010 | Kho et al. |
| 2010/0089096 A1 | 4/2010 | Tamitsuji et al. |
| 2010/0101719 A1 | 4/2010 | Otsuka et al. |
| 2010/0187980 A1 | 7/2010 | Langer et al. |
| 2010/0224320 A1 | 9/2010 | Tsai et al. |
| 2010/0316871 A1 | 12/2010 | Fujiwara et al. |

(56) References Cited

U.S. PATENT DOCUMENTS

| | | |
|---|---|---|
| 2011/0001251 A1 | 1/2011 | Gou et al. |
| 2011/0012873 A1 | 1/2011 | Prest et al. |
| 2011/0024166 A1 | 2/2011 | Chang et al. |
| 2011/0026236 A1 | 2/2011 | Kondo et al. |
| 2011/0042649 A1 | 2/2011 | Duvall et al. |
| 2011/0045239 A1 | 2/2011 | Takaya et al. |
| 2011/0048611 A1 | 3/2011 | Carre et al. |
| 2011/0064953 A1 | 3/2011 | O'Rourke et al. |
| 2011/0069467 A1 | 3/2011 | Flaim et al. |
| 2011/0102346 A1 | 5/2011 | Orsley et al. |
| 2011/0111194 A1 | 5/2011 | Carre et al. |
| 2011/0123787 A1 | 5/2011 | Tomamoto et al. |
| 2011/0256385 A1 | 10/2011 | Matsuzaki et al. |
| 2011/0272090 A1 | 11/2011 | Higuchi |
| 2011/0308739 A1 | 12/2011 | McCutcheon et al. |
| 2011/0311789 A1 | 12/2011 | Loy et al. |
| 2011/0318544 A1 | 12/2011 | Chen et al. |
| 2012/0009703 A1 | 1/2012 | Feinstein et al. |
| 2012/0034437 A1 | 2/2012 | Puligadda et al. |
| 2012/0035309 A1 | 2/2012 | Zhu et al. |
| 2012/0045611 A1 | 2/2012 | Shih et al. |
| 2012/0052654 A1 | 3/2012 | Yang et al. |
| 2012/0061881 A1 | 3/2012 | Bae et al. |
| 2012/0063952 A1 | 3/2012 | Hong et al. |
| 2012/0080403 A1 | 4/2012 | Tomamoto et al. |
| 2012/0083098 A1 | 4/2012 | Berger et al. |
| 2012/0118478 A1 | 5/2012 | Park et al. |
| 2012/0132885 A1 | 5/2012 | Lippert et al. |
| 2012/0153496 A1 | 6/2012 | Lee et al. |
| 2012/0156457 A1 | 6/2012 | Kondo |
| 2012/0156480 A1 | 6/2012 | Kondo et al. |
| 2012/0171454 A1 | 7/2012 | Kondo |
| 2012/0193029 A1 | 8/2012 | Fay et al. |
| 2012/0202010 A1 | 8/2012 | Bearinger et al. |
| 2012/0202030 A1 | 8/2012 | Kondo et al. |
| 2012/0228617 A1 | 9/2012 | Ko et al. |
| 2012/0235315 A1 | 9/2012 | Wu et al. |
| 2012/0258320 A1 | 10/2012 | Berger |
| 2012/0272800 A1 | 11/2012 | Lacan et al. |
| 2012/0276689 A1 | 11/2012 | Canale et al. |
| 2013/0037960 A1 | 2/2013 | Sadaka et al. |
| 2013/0192574 A1 | 8/2013 | Dukkipati et al. |
| 2013/0203265 A1 | 9/2013 | Hubbard et al. |
| 2013/0239617 A1 | 9/2013 | Dannoux |
| 2013/0280495 A1 | 10/2013 | Matsumoto |
| 2014/0106141 A1 | 4/2014 | Bellman et al. |
| 2014/0106150 A1 | 4/2014 | Decker et al. |
| 2014/0130969 A1 | 5/2014 | McCutcheon et al. |
| 2014/0165654 A1 | 6/2014 | Bellman et al. |
| 2014/0166199 A1 | 6/2014 | Bellman et al. |
| 2014/0170378 A1 | 6/2014 | Bellman et al. |
| 2014/0220327 A1 | 8/2014 | Adib et al. |
| 2014/0295590 A1 | 10/2014 | Oh et al. |
| 2015/0266276 A1 | 9/2015 | Vissing et al. |
| 2015/0329415 A1 | 11/2015 | Bellman et al. |

FOREIGN PATENT DOCUMENTS

| | | |
|---|---|---|
| CN | 101916022 B | 10/2012 |
| CN | 102820262 A | 12/2012 |
| CN | 102815052 B | 8/2016 |
| DE | 10323304 | 4/2004 |
| DE | 10323303 A1 | 11/2012 |
| EP | 2270865 A2 | 2/2004 |
| EP | 2270865 A3 | 2/2004 |
| EP | 1628339 A1 | 1/2005 |
| EP | 2128105 A1 | 2/2008 |
| EP | 2128105 | 2/2009 |
| EP | 20100018505 | 1/2010 |
| GB | 1373559 A | 11/1974 |
| GB | 1583544 A | 7/1976 |
| GB | 2481187 A | 6/2010 |
| IN | 200906585 | 4/2012 |
| JP | 1993096235 | 4/1993 |
| JP | 2000241804 A | 9/2000 |
| JP | 2002348150 | 12/2002 |
| JP | 2003077187 A | 3/2003 |
| JP | 2004178891 A | 6/2004 |
| JP | 2006003684 | 1/2006 |
| JP | 2007138144 A | 6/2007 |
| JP | 4036018 B2 | 11/2007 |
| JP | 2008072087 A | 3/2008 |
| JP | 2008123948 A | 5/2008 |
| JP | 2010018505 A | 7/2008 |
| JP | 2009028922 A | 2/2009 |
| JP | 2009028923 A | 2/2009 |
| JP | 2009184172 A | 8/2009 |
| JP | 2010167484 A | 8/2010 |
| JP | 4625913 B2 | 11/2010 |
| JP | 2011201976 A | 10/2011 |
| JP | 2011201977 A | 10/2011 |
| JP | 2011235532 A | 11/2011 |
| JP | 2011236349 A | 11/2011 |
| JP | 5057657 B | 10/2012 |
| JP | 2012212939 A | 11/2012 |
| JP | 05111620 B2 | 1/2013 |
| JP | 2013184346 | 9/2013 |
| JP | 2013184872 | 9/2013 |
| JP | 2014019597 | 2/2014 |
| JP | 2015093405 A | 5/2015 |
| JP | 2015093795 A | 5/2015 |
| JP | 2015116694 A | 6/2015 |
| KR | 10-20080113576 | 12/2008 |
| KR | 10-20100057521 | 5/2010 |
| KR | 10-20110045136 | 5/2011 |
| KR | 2013044774 A | 10/2011 |
| KR | 10-20110134708 | 12/2011 |
| KR | 10-20120033284 | 4/2012 |
| KR | 2012031698 A | 4/2012 |
| KR | 10-20120056227 | 6/2012 |
| KR | 20130095605 | 6/2012 |
| KR | 20120100274 | 9/2012 |
| KR | 2013003997 A | 12/2013 |
| WO | 1992022604 | 12/1992 |
| WO | 2005048669 A1 | 5/2005 |
| WO | 2006093639 A1 | 9/2006 |
| WO | 2007-121524 A | 11/2007 |
| WO | 2008044884 A1 | 4/2008 |
| WO | 2010098762 A1 | 9/2010 |
| WO | 2010121524 | 10/2010 |
| WO | 2011-104500 A1 | 1/2011 |
| WO | 2012000686 | 1/2012 |
| WO | 2012057893 | 5/2012 |
| WO | 2010079688 | 6/2012 |
| WO | 2011-142280 A1 | 10/2012 |
| WO | 2013044941 | 4/2013 |
| WO | 2013058217 | 4/2013 |
| WO | 2013179881 | 5/2013 |
| WO | 2013119737 A2 | 8/2013 |
| WO | 2014093193 | 6/2014 |
| WO | 2014093740 | 6/2014 |
| WO | 2014093775 | 6/2014 |
| WO | 2014093776 | 6/2014 |
| WO | 2012144499 A1 | 7/2014 |
| WO | 2014151353 | 9/2014 |
| WO | 2015054098 | 4/2015 |
| WO | 2015057605 | 4/2015 |
| WO | 2015113020 A1 | 7/2015 |
| WO | 2015113023 A1 | 7/2015 |
| WO | 2015119210 A1 | 8/2015 |
| WO | 2015156395 A1 | 10/2015 |
| WO | 2015157202 A1 | 10/2015 |
| WO | 2015163134 A1 | 10/2015 |
| WO | 2016017645 A1 | 2/2016 |
| WO | 2016209897 A1 | 12/2016 |

OTHER PUBLICATIONS

Wu, Calculation of Interfacial Tension in Polymer Systems, J. Polymer. Sci.: Part C, No. 34, pp. 19-30 (1971).

Biederman et al. "The properties of films prepared by the rf sputtering of PTFE and plasma polymerization of some freons", Vacuum. vol. 31, No. 7. Jan. 1, 1981 pp. 285-289.

(56) References Cited

OTHER PUBLICATIONS

Terlingen et al. "Plasma Modification of Polymeric Surfaces for Biomedical Applications", Advanced Biomaterials in Biomedical Engineering and Drug Delivery Systems, 1996. p. 38.
Stoffels WW et al: "Polymerization of fluorocarbons in reactive ion etching plasmas" Journal of Vacuum Science and Technology, Part A, vol. 16, No. 1, Jan. 1, 1998, pp. 87-95.
ISR from PCT/US2015/012865.
ISR from WO2014/151353.
ISR from PCT/US2015/013017.
Iller Chemistry of Sllcia Ch. 6, copyrighted material date 1979; Chapter 6 The Surface Chemistryof Silica.
Sindorf and Marciel J Phys. Chem. 1982, 86, 5208-5219—Cross-Polarization/Magic-Angle-Spinning Silicon-29 Nuclear Magnetic Resonance Study of Silica Gel Using Trimethylsilane Bonding as a Probe of Surface Geometry and Reactivity.
Elsevier: Zhuravlev SiO2; Colloids and Surfaces A: Physicochemical and Engineering Aspects 173 (2000) 1-38; Institute of Physical Chemistry, Russian Academy of Sciences, Leninsky Prospect 31, Moscow 117915, Russia; accepted Feb. 21, 2000.
Elsevier: Applied Surface Science 143_1999. 301-308; accepted Dec. 22, 1998; The deposition of anti-adhesive ultra-thin teflon-like films and their interaction with polymers during hot embossing.
1994 American Chemical Society; Langmuir 1994,IO, 3887-3897; Dynamic Contact Angles and Contact Angle Hysteresis of Plasma Polymers.
1994 American Chemical Society; Langmuir 1994,10, 2766-2773; Surface Forces between Plasma Polymer Films.
Elsevier: Science Direct; Journal of Non-Crystalline Solids 316(2003) 349-363; Surface chemistry and trimethylsilyl functionalization of St€ ober silica sols T.I. Suratwala *, M.L. Hanna, E.L. Miller, P.K. Whitman, I.M. Thomas, P.R. Ehrmann, R.S. Maxwell, A.K. Burnham Lawrence Livermore National Laboratory, P.O. Box 808, Livermore, CA 94551, USA; received in revised form Mar. 4, 2002.
PCT—International Search Report form 220 for WO 14/093740; dated Mar. 25, 2014.
PCT—International Search Report form 220 for WO 14/093776; dated Mar. 21, 2014.
PCT—International Search Report form 220 for WO 14/093193; dated Mar. 24, 2014.
Polymer Interface and Adhesion, S. Wu, 1982, Marcel Dekker Inc. Chapter 9—Modifications of Polymer Surfaces, pp. 298-321.
Reversible Silicon Wafer Bonding for Surface Protection: Water-Ehanced Debonding, Tong, et al., J. Electrochem. Soc., vol. 139, No. 11, Nov. 1992, The Electrochemical Society, Inc. pp. L101-L102.
Worldwide First Ultra-thin LTPS-TFT LCD by a Glass on Carrier Technology, Chiao, et al., v3, submitted to SID 2015.
ASTM International E595-07, Standard Test Method for Total Mass Loss and Collected Volatile Condensable Materials from Outgassing in a Vacuum Environment (2013).
2006 Gelest Brochure on Thermal Stability of Silanes, p. 14.
2014 Gelest Brochure—Silane Coupling Agents Connecting Across Boundaries.
Chemraz Periluoroelastomers—Seals that Withstand the Test of Time, Greene Tweed, 2000.
Perlast G67P—Technical Data Sheet, Issue 4, Revision 1, Jan. 2006.
DuPont Kalrez Perfluoroelastomer Parts—Physical Properties and Product Comparisons, Technical Information—Rev. 11, Sep. 2012.
Techniques for the Characterization of Fluoroelastomers, Hiltz and Smith, Defence R&D Canada—Atlantic Technical Memorandum 2009-246, Dec. 2009.
Crosslinking of Fluoroelastomers by "Click" Azide-Nitrile Cycloaddition, Tillet et al. Journal of Polymer Science, Part A: Polymer Chemistry, 2015, 53, pp. 1171-1173.
Trelleborg Sealing Solutions, Isolast perflurorelastomer seals, Edition Nov. 2008.
Preparation and Properties of Plasma-Deposited Films with Surface Energies Varying Over a Wide Range, Haque and Ratner, Journal of Applied Polymer Science, vol. 32, 4369-4381 (1986) John Wiley & Sons.
Surface-Free Energy of Silicon-Based Plasma Polymer Films, Chech et al., Silanes and Other Coupling Agents, vol. 5, Koninklijke Brill NV, Leiden, 2009, pp. 333-348.
ISR from WO2015/057605.
ISR from PCT/US2015/013012.
ISR from WO2015/054098.
ISR from WO2014/093775.
Boscher et al; "Influence of Cyclic Organosilicon Precursors on the Corrosion of Aluminium Coated Sheet by Atmospheric Pressure Dielectric Barrier Discharge"; Surface and Coatings Technology 205; (2011) 5350-5357.
Haller; "Polymerization of Aromatic Silanes in RF Plasmas"; J. Electrochem Soc.: Solid-State Science and Technology; vol. 129, No. 1; Jan. 1982; p. 180-183.
International Search Report and Written Opinion of the International Searching Authority; PCT/US2013/073785; dated Mar. 24, 2014; 11 Pages; Korean Patent Office.
International Search Report and Written Opinion of the International Searching Authority; PCT/US2013/074859; dated Mar. 25, 2014; 10 Pages; Korean Patent Office.
International Search Report and Written Opinion of the International Searching Authority; PCT/US2013/074924; dated Mar. 27, 2014; 14 Pages; Korean Patent Office.
International Search Report and Written Opinion of the International Searching Authority; PCT/US2013/074926; dated Mar. 21, 2014; 13 Pages; European Patent Office.
International Search Report and Written Opinion of the International Searching Authority; PCT/US2014/059237; dated Mar. 11, 2015; 15 Pages; European Patent Office.
International Search Report and Written Opinion of the International Searching Authority; PCT/US2014/060340; dated Jan. 29, 2015; 13 Pages; European Patent Office.
International Search Report and Written Opinion of the International Searching Authority; PCT/US2016/038663; dated Sep. 23, 2016; 11 Pages; European Patent Office.
International Search Report of the International Searching Authority; PCT/US2016/032843; dated Aug. 10, 2016; 14 Pages; European Patent Office.
Kuritka et al; "Mass Spectrometry Characterization of Methylphenylsilane-Hydrogen RF Plasmas"; Plasma Process. Polym. 2007, 4, 53-61.
Merche et al; "Atmospheric Plasmas for Thin Film Deposition: A Critical Review"; Thin Solid Films 520, (2012) 4219-4236.
Nagai et al; "Structure and Morphology of Phenylsilanes Polymer Films Synthesized by the Plasma Polymerization Method"; Journal of Material Science 33, (1998); 1897-1905.
Nehlsen et al; "Gas Permeation Properties of Plasma Polymerized Thin Film Siloxane-Type Membranes for Temperature Up to 350° C."; Journal of Membrane Science; 106 (1995) 1-7.
Salyk et al; "Plasma Polymerisation of Methylphenylsilane"; Surface & Coatings Technology, 20, (2005) p. 486-489.
Shieh et al; "Modifications of Low Dielectric Constant Fluorinated Amorphous Carbon Films by Multiple Plasma Treatments"; J. Electro. Soc.; 149 (7) G384-G390 (2002).
Hair; "Hydroxyl Groups on Silica Surface", Journal of Non-Crystalline Solids; 19 (1975) 299-309, © North-Holland Publishing.
McMillian et al; "Hydroxyl Sites in SiO2 Glass: A Note on Irfrared and Raman Spectra", American Mineralogist, vol. 71, pp. 772-778, 1986.

* cited by examiner

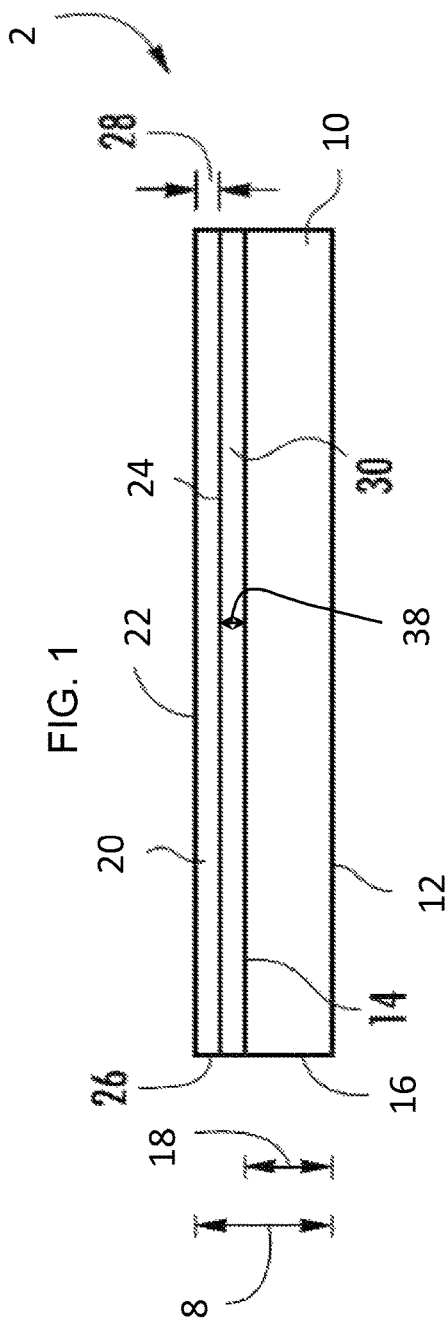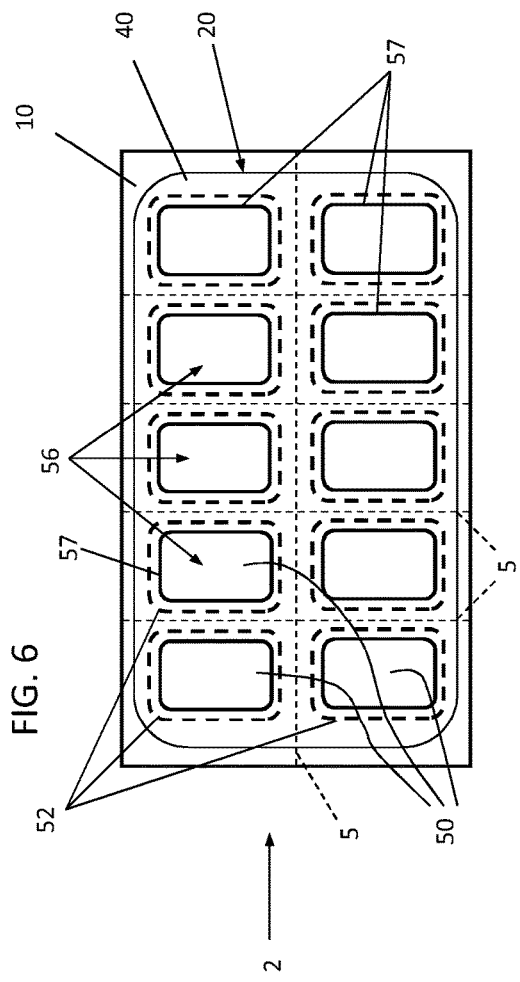

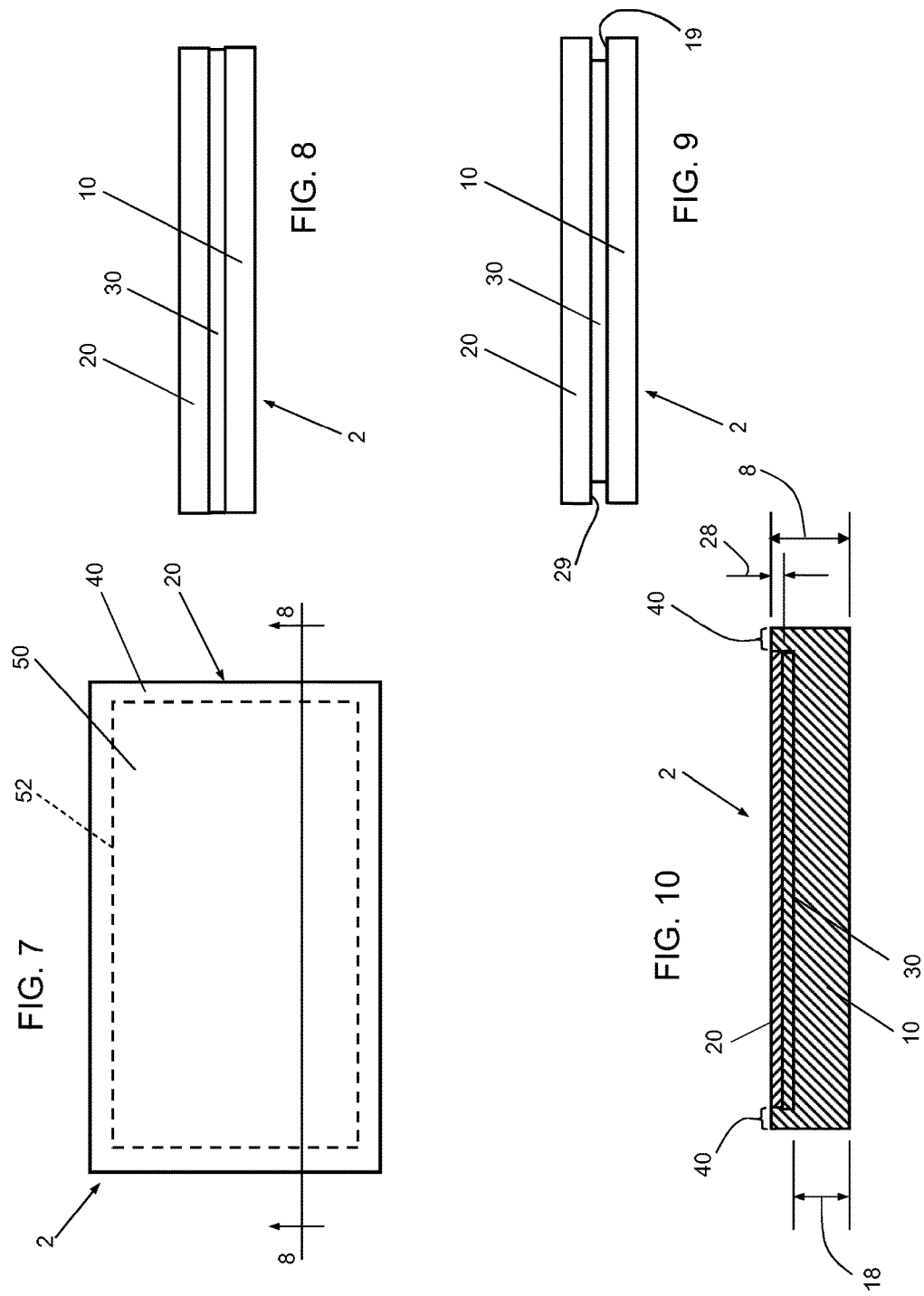

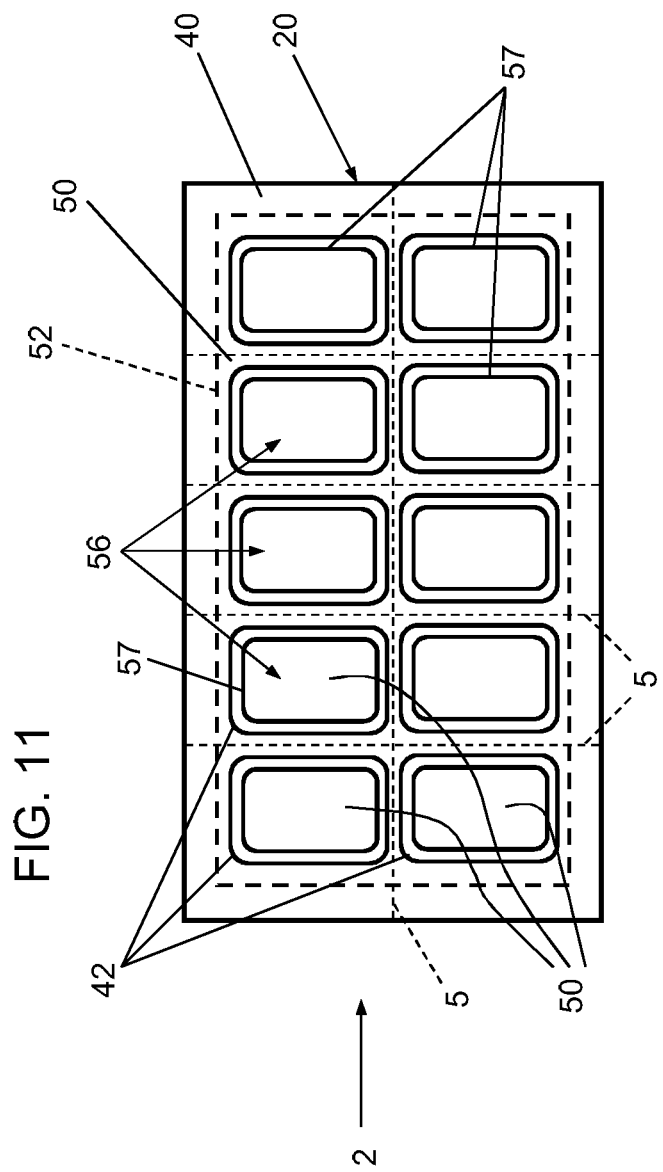

— FACILITATED PROCESSING FOR CONTROLLING BONDING BETWEEN SHEET AND CARRIER

CROSS-REFERENCE TO RELATED APPLICATIONS

This application claims the benefit of priority under 35 U.S.C. § 365 of International Patent Application Serial No. PCT/US13/74859 filed on Dec. 13, 2013 designating the United States of America, which claims the benefit of priority under 35 U.S.C. § 119 of U.S. Provisional Application Ser. No. 61/736,880, filed on Dec. 13, 2012, the content of each of which is relied upon and incorporated herein by reference in its entirety.

FIELD OF THE INVENTION

The present invention is directed to articles having flexible sheets on carriers and, more particularly to articles and methods enabling facilitated assembly of flexible glass sheets onto glass carriers.

TECHNICAL BACKGROUND

Flexible substrates offer the promise of cheaper devices using roll-to-roll processing, and the potential to make thinner, lighter, more flexible and durable displays. However, the technology, equipment, and processes required for roll-to-roll processing of high quality displays are not yet fully developed. Since panel makers have already heavily invested in toolsets to process large sheets of glass, laminating a flexible substrate to a carrier and making display devices by a sheet-to-sheet processing offers a shorter term solution to develop the value proposition of thinner, lighter, and more flexible displays. Displays have been demonstrated on polymer sheets for example polyethylene naphthalate (PEN) where the device fabrication was sheet to sheet with the PEN laminated to a glass carrier. The upper temperature limit of the PEN limits the device quality and process that can be used. In addition, the high permeability of the polymer substrate leads to environmental degradation of OLED devices where a near hermetic package is required. Thin film encapsulation offers the promise to overcome this limitation, but it has not yet been demonstrated to offer acceptable yields at large volumes.

In a similar manner, display devices can be manufactured using a glass carrier laminated to one or more thin glass substrates. It is anticipated that the low permeability and improved temperature and chemical resistance of the thin glass will enable higher performance longer lifetime flexible displays.

However, the thermal, vacuum, solvent and acidic, and ultrasonic, Flat Panel Display (FPD) processes require a robust bond for thin glass bound to a carrier. FPD processes typically involve vacuum deposition (sputtering metals, transparent conductive oxides and oxide semiconductors, Chemical Vapor Deposition (CVD) deposition of amorphous silicon, silicon nitride, and silicon dioxide, and dry etching of metals and insulators), thermal processes (including ~300-400° C. CVD deposition, up to 600° C. p-Si crystallization, 350-450° C. oxide semiconductor annealing, up to 650° C. dopant annealing, and ~200-350° C. contact annealing), acidic etching (metal etch, oxide semiconductor etch), solvent exposure (stripping photoresist, deposition of polymer encapsulation), and ultrasonic exposure (in solvent stripping of photoresist and aqueous cleaning, typically in alkaline solutions).

Adhesive wafer bonding has been widely used in Micromechanical Systems (MEMS) and semiconductor processing for back end steps where processes are less harsh. Commercial adhesives by Brewer Science and Henkel are typically thick polymer adhesive layers, 5-200 microns thick. The large thickness of these layers creates the potential for large amounts of volatiles, trapped solvents, and adsorbed species to contaminate FPD processes. These materials thermally decompose and outgas above ~250° C. The materials also may cause contamination in downstream steps by acting as a sink for gases, solvents and acids which can outgas in subsequent processes.

U.S. Provisional Application Ser. No. 61/596,727 filed on Feb. 8, 2012, entitled Processing Flexible Glass with a Carrier (hereinafter US '727) discloses that the concepts therein involve bonding a thin sheet, for example, a flexible glass sheet, to a carrier initially by van der Waals forces, then increasing the bond strength in certain regions while retaining the ability to remove portions of the thin sheet after processing the thin sheet/carrier to form devices (for example, electronic or display devices, components of electronic or display devices, organic light emitting device (OLED) materials, photo-voltaic (PV) structures, or thin film transistors), thereon. At least a portion of the thin glass is bonded to a carrier such that there is prevented device process fluids from entering between the thin sheet and carrier, whereby there is reduced the chance of contaminating downstream processes, i.e., the bonded seal portion between the thin sheet and carrier is hermetic, and in some preferred embodiments, this seal encompasses the outside of the article thereby preventing liquid or gas intrusion into or out of any region of the sealed article.

US '727 goes on to disclose that in low temperature polysilicon (LTPS) (low temperature compared to solid phase crystallization processing which can be up to about 750° C.) device fabrication processes, temperatures approaching 600° C. or greater, vacuum, and wet etch environments may be used. These conditions limit the materials that may be used, and place high demands on the carrier/thin sheet. Accordingly, what is desired is a carrier approach that utilizes the existing capital infrastructure of the manufacturers, enables processing of thin glass, i.e., glass having a thickness ≤0.3 mm thick, without contamination or loss of bond strength between the thin glass and carrier at higher processing temperatures, and wherein the thin glass de-bonds easily from the carrier at the end of the process.

One commercial advantage to the approach disclosed in US '727 is that, as noted in US '727, manufacturers will be able to utilize their existing capital investment in processing equipment while gaining the advantages of the thin glass sheets for PV, OLED, LCDs and patterned Thin Film Transistor (TFT) electronics, for example. Additionally, that approach enables process flexibility, including: that for cleaning and surface preparation of the thin glass sheet and carrier to facilitate bonding; that for strengthening the bond between the thin sheet and carrier at the bonded area; that for maintaining releasability of the thin sheet from the carrier at the non-bonded (or reduced/low-strength bond) area; and that for cutting the thin sheets to facilitate extraction from the carrier.

In the glass-to-glass bonding process, the glass surfaces are cleaned to remove all metal, organic and particulate residues, and to leave a mostly silanol terminated surface.

The glass surfaces are first brought into intimate contact where van der Waals and/or Hydrogen-bonding forces pull them together. With heat and optionally pressure, the surface silanol groups condense to form strong covalent Si—O—Si bonds across the interface, permanently fusing the glass pieces. Metal, organic and particulate residue will prevent bonding by obscuring the surface preventing the intimate contact required for bonding. A high silanol surface concentration is also required to form a strong bond as the number of bonds per unit area will be determined by the probability of two silanol species on opposing surfaces reacting to condense out water. Zhuravlel has reported the average number of hydroxyls per $nm^2$ for well hydrated silica as 4.6 to 4.9. Zhuravlel, L. T., *The Surface Chemistry of Amorphous Silika, Zhuravlev Model*, Colloids and Surfaces A: Physiochemical Engineering Aspects 173 (2000) 1-38. In US '727, a non-bonding region is formed within a bonded periphery, and the primary manner described for forming such non-bonding area is increasing surface roughness. An average surface roughness of greater than 2 nm Ra can prevent glass to glass bonds forming during the elevated temperature of the bonding process.

SUMMARY

There is a need for a facilitated manner of assembling a thin sheet—carrier article that can withstand the rigors of the FPD processing, including high temperature processing (without outgassing that would be incompatible with the semiconductor or display making processes in which it will be used), yet allow sections of the thin sheet to be removed from the carrier. The present specification describes ways to control the adhesion between the carrier and thin sheet to create a temporary bond sufficiently strong to survive FPD processing (including LTPS processing) but weak enough to permit debonding of portions of the sheet from the carrier, even after high-temperature processing. Such controlled bonding can be utilized to create an article having patterned areas of controlled bonding and covalent bonding between a carrier and a sheet. More specifically, the present disclosure provides surface modification layers (including various materials and associated surface heat treatments), that may be provided on the thin sheet, the carrier, or both, to control both room-temperature van der Waals, and/or hydrogen, bonding and high temperature covalent bonding between portions of the thin sheet and carrier. Even more specifically, the room-temperature bonding may be controlled so as to be sufficient to hold the thin sheet and carrier together during vacuum processing, wet processing, and/or ultrasonic cleaning processing. And at the same time, the high temperature covalent bonding may be controlled so as to prevent a permanent bond between portions of the thin sheet and carrier during high temperature processing, as well as maintain a sufficient bond to prevent delamination during high temperature processing. In alternative embodiments, the surface modification layers may be used to create various controlled bonding areas (wherein the carrier and sheet remain sufficiently bonded through various processes, including vacuum processing, wet processing, and/or ultrasonic cleaning processing), together with covalent bonding regions to provide for further processing options, for example, maintaining hermeticity between the carrier and sheet even after dicing the article into smaller pieces for additional device processing. Still further, some surface modification layers provide control of the bonding between the carrier and sheet while, at the same time, reduce outgassing emissions during the harsh conditions in an FPD (for example LTPS) processing environment, including high temperature and/or vacuum processing, for example.

Additional features and advantages will be set forth in the detailed description which follows, and in part will be readily apparent to those skilled in the art from the description or recognized by practicing the various aspects as exemplified in the written description and the appended drawings. It is to be understood that both the foregoing general description and the following detailed description are merely exemplary of the various aspects, and are intended to provide an overview or framework to understanding the nature and character of the invention as it is claimed.

The accompanying drawings are included to provide a further understanding of principles of the invention, and are incorporated in and constitute a part of this specification. The drawings illustrate one or more embodiment(s), and together with the description serve to explain, by way of example, principles and operation of the invention. It is to be understood that various features disclosed in this specification and in the drawings can be used in any and all combinations. By way of non-limiting example the various features may be combined with one another as set forth in the appended claims

BRIEF DESCRIPTION OF THE DRAWINGS

FIG. 1 is a schematic side view of an article having carrier bonded to a thin sheet with a surface modification layer therebetween.

FIG. 6 is a schematic top view of a thin sheet bonded to a carrier by bonding areas.

FIG. 7 is a schematic top view of a sheet and carrier.

FIG. 8 is a cross-sectional view as taken along line 8-8 in FIG. 7 after the sheet and carrier have been connected via a surface modification layer.

FIG. 9 is a cross-sectional view as taken along line 8-8 in FIG. 7 after the surface modification layer has been partially removed.

FIG. 10 is a cross-sectional view as taken along line 8-8 in FIG. 7 after the carrier and sheet have been bonded in the bonding region.

FIG. 11 is a schematic top view of a sheet and a carrier having patterned bonding areas.

DETAILED DESCRIPTION

Figure 2:
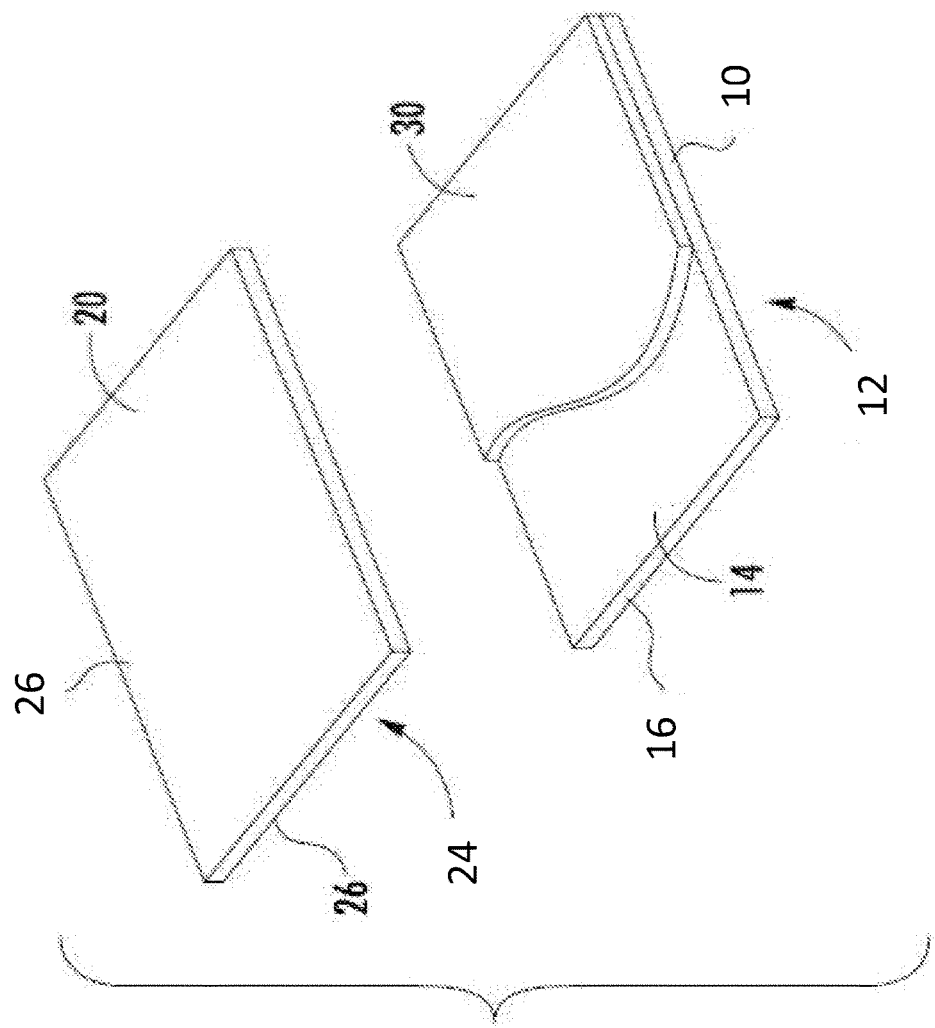
FIG. 2 is an exploded and partially cut-away view of the article in FIG. 1.

In the following detailed description, for purposes of explanation and not limitation, example embodiments disclosing specific details are set forth to provide a thorough understanding of various principles of the present invention. However, it will be apparent to one having ordinary skill in the art, having had the benefit of the present disclosure, that the present invention may be practiced in other embodiments that depart from the specific details disclosed herein. Moreover, descriptions of well-known devices, methods and materials may be omitted so as not to obscure the description of various principles of the present invention. Finally, wherever applicable, like reference numerals refer to like elements.

Ranges can be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

Directional terms as used herein—for example up, down, right, left, front, back, top, bottom—are made only with reference to the figures as drawn and are not intended to imply absolute orientation.

As used herein, the singular forms "a," "an" and "the" include plural referents unless the context clearly dictates otherwise. Thus, for example, reference to a "component" includes aspects having two or more such components, unless the context clearly indicates otherwise.

In US '727 there are provided solutions for allowing the processing of a thin glass sheet on a carrier, whereby at least portions of the thin glass sheet remain "non-bonded" so that devices processed on the thin glass sheet may be removed from the carrier. However, the periphery of the thin glass is permanently (or covalently, or hermetically) bonded to the carrier glass through the formation of covalent Si—O—Si bonds. This covalently bonded perimeter hermetically seals the carrier with the thin glass in this permanently bonded zone so that process fluids cannot enter between the thin sheet and carrier.

The present disclosure sets forth articles and methods for facilitating the formation of a hermetic bond between the thin sheet and carrier so as to enable a thin sheet to be processed through the harsh environment of the FPD processing lines, including high temperature processing—wherein high temperature processing is processing at a temperature $\geq 400°$ C., and may vary depending upon the type of device being made, for example, temperatures up to about 450° C. as in amorphous silicon or amorphous indium gallium zinc oxide (IGZO) backplane processing, up to about 500-550° C. as in crystalline IGZO processing, or up to about 600-650° C. as is typical in LTPS processes.

As shown in FIGS. 1 and 2, a glass article 2 has a thickness 8, and includes a carrier 10 having a thickness 18, a thin sheet 20 (i.e., one having a thickness of ≤300 microns, including but not limited to thicknesses of, for example, 10-50 microns, 50-100 microns, 100-150 microns, 150-300 microns, 300, 250, 200 190, 180, 170, 160, 150 140, 130, 120 110 100, 90, 80, 70, 60, 50, 40 30, 20, or 10, microns) having a thickness 28, and a surface modification layer 30 having a thickness 38. The glass article 2 is designed to allow the processing of thin sheet 20 in equipment designed for thicker sheets (i.e., those on the order of ≥0.4 mm, e.g., 0.4 mm, 0.5 mm, 0.6 mm, 0.7 mm, 0.8 mm, 0.9 mm, or 1.0 mm) although the thin sheet 20 itself is ≤300 microns. That is, the thickness 8, which is the sum of thicknesses 18, 28, and 38, is designed to be equivalent to that of the thicker sheet for which a piece of equipment—for example, equipment designed to dispose electronic device components onto substrate sheets—was designed to process. For example, if the processing equipment was designed for a 700 micron sheet, and the thin sheet had a thickness 28 of 300 microns, then thickness 18 would be selected as 400 microns, assuming that thickness 38 is negligible. That is, the surface modification layer 30 is not shown to scale; instead, it is greatly exaggerated for sake of illustration only. Additionally, the surface modification layer is shown in cut-away. In actuality, the surface modification layer would be disposed uniformly over the bonding surface 14 when providing a reusable carrier. Typically, thickness 38 will be on the order of nanometers, for example 0.1 to 2.0, or up to 10 nm, and in some instances may be up to 100 nm. The thickness 38 may be measured by ellipsometer. Additionally, the presence of a surface modification layer may be detected by surface chemistry analysis, for example by ToF Sims mass spectrometry. Accordingly, the contribution of thickness 38 to the article thickness 8 is negligible and may be ignored in the calculation for determining a suitable thickness 18 of carrier 10 for processing a given thin sheet 20 having a thickness 28. However, to the extent that surface modification layer 30 has any significant thickness 38, such may be accounted for in determining the thickness 18 of a carrier 10 for a given thickness 28 of thin sheet 20, and a given thickness for which the processing equipment was designed.

Carrier 10 has a first surface 12, a bonding surface 14, a perimeter 16, and thickness 18. Further, the carrier 10 may be of any suitable material including glass, for example. The carrier need not be glass, but instead can be ceramic, glass-ceramic, or metal (as the surface energy and/or bonding may be controlled in a manner similar to that described below in connection with a glass carrier). If made of glass, carrier 10 may be of any suitable composition including alumino-silicate, boro-silicate, alumino-boro-silicate, soda-lime-silicate, and may be either alkali containing or alkali-free depending upon its ultimate application. Thickness 18 may be from about 0.2 to 3 mm, or greater, for example 0.2, 0.3, 0.4, 0.5, 0.6, 0.65, 0.7, 1.0, 2.0, or 3 mm, or greater, and will depend upon the thickness 28, and thickness 38 when such is non-negligible, as noted above. Additionally, the carrier 10 may be made of one layer, as shown, or multiple layers (including multiple thin sheets) that are bonded together. Further, the carrier may be of a Gen 1 size or larger, for example, Gen 2, Gen 3, Gen 4, Gen 5, Gen 8 or larger (e.g., sheet sizes from 100 mm×100 mm to 3 meters×3 meters or greater).

The thin sheet 20 has a first surface 22, a bonding surface 24, a perimeter 26, and thickness 28. Perimeters 16 and 26 may be of any suitable shape, may be the same as one another, or may be different from one another. Further, the thin sheet 20 may be of any suitable material including glass, ceramic, or glass-ceramic, for example. When made of glass, thin sheet 20 may be of any suitable composition, including alumino-silicate, boro-silicate, alumino-boro-silicate, soda-lime-silicate, and may be either alkali containing or alkali free depending upon its ultimate application. The coefficient of thermal expansion of the thin sheet could be matched relatively closely with that of the carrier to prevent warping of the article during processing at elevated temperatures. The thickness 28 of the thin sheet 20 is 300 microns or less, as noted above. Further, the thin sheet may be of a Gen 1 size or larger, for example, Gen 2, Gen 3, Gen 4, Gen 5, Gen 8 or larger (e.g., sheet sizes from 100 mm×100 mm to 3 meters×3 meters or greater).

Not only does the article 2 need to have the correct thickness to be processed in the existing equipment, it will also need to be able to survive the harsh environment in which the processing takes place. For example, flat panel display (FPD) processing may include wet ultrasonic, vacuum, and high temperature (e.g., ≥400° C.), processing. For some processes, as noted above, the temperature may be ≥500° C., or ≥600° C., and up to 650° C.

In order to survive the harsh environment in which article 2 will be processed, as during FPD manufacture for example, the bonding surface 14 should be bonded to bonding surface 24 with sufficient strength so that the thin sheet 20 does not separate from carrier 10. And this strength should be maintained through the processing so that the thin sheet 20 does not separate from the carrier 10 during processing. Further, to allow portions of the thin sheet 20 to be removed from carrier 10, the bonding surface 14 should not be bonded to bonding surface 24 too strongly either by the initially designed bonding force, and/or by a bonding force that results from a modification of the initially designed bonding force as may occur, for example, when the article undergoes processing at high temperatures, e.g., temperatures of ≥400° C. The surface modification layer 30 may be used to control the strength of bonding between bonding surface 14 and bonding surface 24 so as to this objective. The controlled bonding force is achieved by controlling the contributions of van der Waals (and/or hydrogen bonding) and covalent attractive energies to the total adhesion energy which is controlled by modulating the polar and non-polar surface energy components of the thin sheet 20 and the carrier 10. This controlled bonding is strong enough to survive FPD processing (including wet, ultrasonic, vacuum, and thermal processes including temperatures ≥400° C., and in some instances, processing temperatures of ≥500° C., or ≥600° C., and up to 650° C.) and remain de-bondable by application of sufficient separation force and yet by a force that will not cause catastrophic damage (e.g., the breaking or cracking into two or more pieces) to the thin sheet 20 and/or the carrier 10. Such de-bonding permits removal of portions of the thin sheet 20 and the devices fabricated thereon.

Although the surface modification layer 30 is shown as a solid layer between thin sheet 20 and carrier 10, such need not be the case. For example, the layer 30 may be on the order of 0.1 to 2 nm thick, and may not completely cover every bit of the bonding surface 14. For example, the coverage may be ≤100%, from 1% to 100%, from 10% to 100%, from 20% to 90%, or from 50% to 90%. In other embodiments, the layer 30 may be up to 10 nm thick, or in other embodiments even up to 100 nm thick. The surface modification layer 30 may be considered to be disposed between the carrier 10 and thin sheet 20 even though it may not contact one or the other of the carrier 10 and thin sheet 20. In any event, an important aspect of the surface modification layer 30 is that it modifies the ability of the bonding surface 14 to bond with bonding surface 24, thereby controlling the strength of the bond between the carrier 10 and the thin sheet 20. The material and thickness of the surface modification layer 30, as well as the treatment of the bonding surfaces 14, 24 prior to bonding, can be used to control the strength of the bond (energy of adhesion) between carrier 10 and thin sheet 20.

In general, the energy of adhesion between two surfaces is given by ("A theory for the estimation of surface and interfacial energies. I. derivation and application to interfacial tension", L. A. Girifalco and R. J. Good, J. Phys. Chem., V 61, p 904):

$$W = \gamma_1 + \gamma_2 - \gamma_{12} \quad (1)$$

where $\gamma_1$, $\gamma_2$ and $\gamma_{12}$ are the surface energies of surface 1, surface 2 and the interfacial energy of surface 1 and 2 respectively. The individual surface energies are usually a combination of two terms; a dispersion component $\gamma^d$, and a polar component $\gamma^p$ $$\gamma = \gamma^d + \gamma^p \quad (2)$$

When the adhesion is mostly due to London dispersion forces ($\gamma^d$) and polar forces for example hydrogen bonding ($\gamma^p$), the interfacial energy could be given by (Girifalco and R. J. Good, as mentioned above):

$$\gamma_{12} = \gamma_1 + \gamma_2 - 2\sqrt{\gamma_1^d \gamma_2^d} - 2\sqrt{\gamma_1^p \gamma_2^p} \quad (3)$$

After substituting (3) in (1), the energy of adhesion could be approximately calculated as:

$$W \sim 2[\sqrt{\gamma_1^d \gamma_2^d} + \sqrt{\gamma_1^p \gamma_2^p}] \quad (4)$$

In the above equation (4), only van der Waal (and/or hydrogen bonding) components of adhesion energies are considered. These include polar-polar interaction (Keesom), polar-non polar interaction (Debye) and nonpolar-nonpolar interaction (London). However, other attractive energies may also be present, for example covalent bonding and electrostatic bonding. So, in a more generalized form, the above equation is written as:

$$W \sim 2[\sqrt{\gamma_1^d \gamma_2^d} + \sqrt{\gamma_1^p \gamma_2^p}] + w_c + w_e \quad (4)$$

where $w_c$ and $w_e$ are the covalent and electrostatic adhesion energies. The covalent adhesion energy is rather common, as in silicon wafer bonding where an initially hydrogen bonded pair of wafers are heated to a higher temperature to convert much or all the silanol-silanol hydrogen bonds to Si—O—Si covalent bonds. While the initial, room temperature, hydrogen bonding produces an adhesion energy of the order of ~100-200 mJ/m² which allows separation of the bonded surfaces, a fully covalently bonded wafer pair as achieved during high temperature processing (on the order of 400 to 800° C.) has adhesion energy of ~1000-3000 mJ/m² which does not allow separation of the bonded surfaces; instead, the two wafers act as a monolith. On the other hand, if both the surfaces are perfectly coated with a low surface energy material, for example a fluoropolymer, with thickness large enough to shield the effect of the underlying substrate, the adhesion energy would be that of the coating material, and would be very low leading to low or no adhesion between the bonding surfaces 14, 24, whereby the thin sheet 20 would not be able to be processed on carrier 10. Consider two extreme cases: (a) two standard clean 1 (SC1, as known in the art) cleaned glass surfaces saturated with silanol groups bonded together at room temperature via hydrogen bonding (whereby the adhesion energy is ~100-200 mJ/m²) followed by heating to high temperature which converts the silanol groups to covalent Si—O—Si bonds (whereby the adhesion energy becomes 1000-3000 mJ/m²). This latter adhesion energy is too high for the pair of glass surfaces to be detachable; and (b) two glass surfaces perfectly coated with a fluoropolymer with low surface adhesion energy (~12 mJ/m² per surface) bonded at room temperature and heated to high temperature. In this latter case (b), not only do the surfaces not bond (because the total adhesion energy of ~24 mJ/m², when the surfaces are put together, is too low), they do not bond at high temperature either as there are no (or too few) polar reacting groups Between these two extremes, a range of adhesion energies exist, for example between 50-1000 mJ/m², which can produce the desired degree of controlled bonding. Accordingly, the inventors have found various manners of providing a surface modification layer 30 leading to an adhesion energy that is between these two extremes, and such that there can be produced a controlled bonding that is sufficient enough to maintain a pair of glass substrates (for example a glass carrier 10 and a thin glass sheet 20) bonded to one another through the rigors of FPD processing but also of a degree that (even after high temperature processing of, e.g. ≥400° C.) allows the detachment of portions of the thin sheet 20 from the carrier 10 after processing is complete. Moreover, the detachment of portions of the thin sheet 20 from the carrier 10 can be performed by mechanical forces, and in such a manner that there is no catastrophic damage to at least the portions of the thin sheet 20, and preferably also so that there is no catastrophic damage to the carrier 10.

Equation (5) describes that the adhesion energy is a function of four surface energy parameters plus the covalent and electrostatic energy, if any.

An appropriate adhesion energy can be achieved by judicious choice of surface modifiers, i.e., of surface modification layer 30, and/or thermal treatment of the surfaces prior to bonding. The appropriate adhesion energy may be attained by the choice of chemical modifiers of either one or both of bonding surface 14 and bonding surface 24, which in turn control both the van der Waal (and/or hydrogen bonding, as these terms are used interchangeably throughout the specification) adhesion energy as well as the likely covalent bonding adhesion energy resulting from high temperature processing (e.g., on the order of ≥400° C.). For example, taking a bonding surface of SC1 cleaned glass (that is initially saturated with silanol groups with high polar component of surface energy), and coating it with a low energy fluoropolymer provides a control of the fractional coverage of the surface by polar and non-polar groups. This not only offers control of the initial van der Waals (and/or hydrogen) bonding at room temperature, but also provides control of the extent/degree of covalent bonding at higher temperature. Control of the initial van der Waals (and/or hydrogen) bonding at room temperature is performed so as to provide a bond of one surface to the other to allow vacuum and or spin-rinse-dry (SRD) type processing, and in some instances also an easily formed bond of one surface to the other—wherein the easily formed bond can be performed at room temperature without application of externally applied forces over the entire area of the thin sheet 20 as is done in pressing the thin sheet 20 to the carrier 10 with a squeegee, or with a reduced pressure environment. That is, the initial van der Waals bonding provides at least a minimum degree of bonding holding the thin sheet and carrier together so that they do not separate if one is held and the other is allowed to be subjected to the force of gravity. In most cases, the initial van der Walls (and/or hydrogen) bonding will be of such an extent that the article may also go through vacuum, SRD, and ultrasonic processing without the thin sheet delaminating from the carrier. This precise control of both van der Waal (and/or hydrogen bonding) and covalent interactions at appropriate levels via surface modification layer 30 (including the materials from which it is made and/or the surface treatment of the surface to which it is applied), and/or by heat treatment of the bonding surfaces prior to bonding them together, achieves the desired adhesion energy that allows thin sheet 20 to bond with carrier 10 throughout FPD style processing, while at the same time, allowing portions of the thin sheet 20 to be separated (by an appropriate force avoiding damage to the thin sheet 20 and/or carrier) from the carrier 10 after FPD style processing. In addition, in appropriate circumstances, electrostatic charge could be applied to one or both glass surfaces to provide another level of control of the adhesion energy.

FPD processing for example p-Si and oxide TFT fabrication typically involve thermal processes at temperatures above 400° C., above 500° C., and in some instances at or above 600° C., up to 650° C. which would cause glass to glass bonding of a thin glass sheet 20 with a glass carrier 10 in the absence of surface modification layer 30. Therefore controlling the formation of Si—O—Si bonding leads to a reusable carrier. One method of controlling the formation of Si—O—Si bonding at elevated temperature is to reduce the concentration of surface hydroxyls on the surfaces to be bonded.

Figure 3:
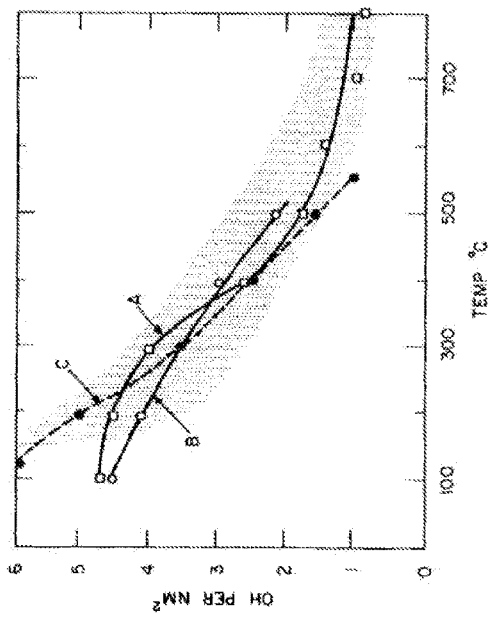
FIG. 3 is a graph of surface hydroxyl concentration on silica as a function of temperature.

As shown in FIG. 3, which is Iler's plot (R. K. Iller: The Chemistry of Silica (Wiley-Interscience, New York, 1979) of surface hydroxyl concentration on silica as a function of temperature, the number of hydroxyls (OH groups) per square nm decreases as the temperature of the surface increases. Thus, heating a silica surface (and by analogy a glass surface, for example bonding surface 14 and/or bonding surface 24) reduces the concentration of surface hydroxyls, decreasing the probability that hydroxyls on two glass surfaces will interact. This reduction of surface hydroxyl concentration in turn reduces the Si—O—Si bonds formed per unit area, lowering the adhesive force. However, eliminating surface hydroxyls requires long annealing times at high temperatures (above 750° C. to completely eliminate surface hydroxyls). Such long annealing times and high annealing temperatures result in an expensive process, and one which is not practical as it is likely to be above the strain point of typical display glass.

From the above analysis, the inventors have found that an article including a thin sheet and a carrier, suitable for FPD processing (including LTPS processing), can be made by balancing the following three concepts:

(1) Modification of the carrier and/or thin sheet bonding surface(s), by controlling initial room temperature bonding, which can be done by controlling van der Waals (and/or hydrogen) bonding, to create a moderate adhesion energy (for example, having a surface energy of >40 mJ/m² per surface prior to the surfaces being bonded) to facilitate initial room temperature bonding, and sufficient to survive non-high-temperature FPD processes, for example, vacuum processing, SRD processing, and/or ultrasonic processing;

(2) Surface modification of a carrier and/or a thin sheet in a manner that is thermally stable to survive FPD processes without outgassing which can cause delamination and/or unacceptable contamination in the device fabrication, for example, contamination unacceptable to the semiconductor and/or display making processes in which the article may be used; and (3) Controlling bonding at high temperatures, which can be done by controlling the carrier surface hydroxyl concentration, and concentration of other species capable of forming strong covalent bonds at elevated temperatures (e.g., temperature ≥400° C.), whereby there can be controlled the bonding energy between the bonding surfaces of the carrier and the thin sheet such that even after high temperature processing (especially through thermal processes in the range of 500-650° C., as in FPD processes) the adhesive force between the carrier and thin sheet remains within a range that allows debonding of portions of the thin sheet from the carrier with a separation force that does not damage at least the thin sheet (and preferably that does not damage either the thin sheet or the carrier), and yet sufficient enough to maintain the bond between the carrier and thin sheet so that they do not delaminate during processing.

Further, the inventors have found that the use of a surface modification layer 30, together with bonding surface preparation as appropriate, can balance the above concepts so as readily to achieve a controlled bonding area, that is, a bonding area that provides a sufficient room-temperature bond between the thin sheet 20 and carrier 10 to allow the article 2 to be processed in FPD type processes (including vacuum and wet processes), and yet one that controls covalent bonding between the thin sheet 20 and carrier 10 (even at elevated temperatures ≥400° C.) so as to allow portions of the thin sheet 20 to be removed from the carrier 10 (without damage to at least the thin sheet, and preferably without damage to the carrier also) after the article 2 has finished high temperature processing, for example, FPD type processing or LTPS processing. To evaluate potential bonding surface preparations, and surface modification layers, that would provide a reusable carrier suitable for FPD processing, a series of tests were used to evaluate the suitability of each. Different FPD applications have different requirements, but LTPS and Oxide TFT processes appear to be the most stringent at this time and, thus, tests representative of steps in these processes were chosen, as these are desired applications for the article 2. Vacuum processes, wet cleaning (including SRD and ultrasonic type processes) and wet etching are common to many FPD applications. Typical aSi TFT fabrication requires processing up to 320° C. Annealing at 400° C. is used in oxide TFT processes, whereas crystallization and dopant activation steps over 600° C. are used in LTPS processing. Accordingly, the following five tests were used to evaluate the likelihood that a particular bonding surface preparation and surface modification layer 30 would allow a thin sheet 20 to remain bonded to a carrier 10 throughout FPD processing, while allowing the thin sheet 20 to be removed from the carrier 10 (without damaging the thin sheet 20 and/or the carrier 10) after such processing (including processing at temperatures ≥400° C.). The tests were performed in order, and a sample progressed from one test to the next unless there was failure of the type that would not permit the subsequent testing.

(1) Vacuum testing. Vacuum compatibility testing was performed in an STS Multiplex PECVD loadlock (available from SPTS, Newport, UK)—The loadlock was pumped by an Ebara A10S dry pump with a soft pump valve (available from Ebara Technologies Inc., Sacramento, Calif. A sample was placed in the loadlock, and then the loadlock was pumped from atmospheric pressure down to 70 mTorr in 45 sec. Failure, indicated by a notation of "F" in the "Vacuum" column of the tables below, was deemed to have occurred if there was: (a) a loss of adhesion between the carrier and the thin sheet (by visual inspection with the naked eye, wherein failure was deemed to have occurred if the thin sheet had fallen off of the carrier or was partially debonded therefrom); (b) bubbling between the carrier and the thin sheet (as determined by visual inspection with the naked eye—samples were photographed before and after the processing, and then compared, failure was determined to have occurred if defects increased in size by dimensions visible to the unaided eye); or (c) movement of the thin sheet relative to the carrier (as determined by visual observation with the naked eye—samples were photographed before and after testing, wherein failure was deemed to have occurred if there was a movement of bond defects, e.g., bubbles, or if edges debonded, or if there was a movement of the thin sheet on the carrier). In the tables below, a notation of "P" in the "Vacuum" column indicates that the sample did not fail as per the foregoing criteria.

(2) Wet process testing. Wet processes compatibility testing was performed using a Semitool model SRD-470S (available from Applied Materials, Santa Clara, Calif.). The testing consisted of 60 seconds 500 rpm rinse, Q-rinse to 15 MOhm-cm at 500 rpm, 10 seconds purge at 500 rpm, 90 seconds dry at 1800 rpm, and 180 seconds dry at 2400 rpm under warm flowing nitrogen. Failure, as indicated by a notation of "F" in the "SRD" column of the tables below, was deemed to have occurred if there was: (a) a loss of adhesion between the carrier and the thin sheet (by visual inspection with the naked eye, wherein failure was deemed to have occurred if the thin sheet had fallen off of the carrier or was partially debonded therefrom); (b) bubbling between the carrier and the thin sheet (as determined by visual inspection with the naked eye—samples were photographed before and after the processing, and then compared, failure was determined to have occurred if defects increased in size by dimensions visible to the unaided eye); or (c) movement of the thin sheet relative to the carrier (as determined by visual observation with the naked eye—samples were photographed before and after testing, wherein failure was deemed to have occurred if there was a movement of bond defects, e.g., bubbles, or if edges debonded, or if there was a movement of the thin sheet on the carrier); or (d) penetration of water under the thin sheet (as determined by visual inspection with an optical microscope at 50×, wherein failure was determined to have occurred if liquid or residue was observable). In the tables below, a notation of "P" in the "SRD" column indicates that the sample did not fail as per the foregoing criteria.

(3) Temperature to 400° C. testing. 400° C. process compatibility testing was performed using an Alwin21 Accuthermo610 RTP (available from Alwin21, Santa Clara Calif. A carrier with a thin sheet bonded thereto was heated in a chamber cycled from room temperature to 400° C. at 6.2° C./min, held at 400° C. for 600 seconds, and cooled at 1° C./min to 300° C. The carrier and thin sheet were then allowed to cool to room temperature. Failure, as indicated by a notation of "F" in the "400° C." column of the tables below, was deemed to have occurred if there was: (a) a loss of adhesion between the carrier and the thin sheet (by visual inspection with the naked eye, wherein failure was deemed to have occurred if the thin sheet had fallen off of the carrier or was partially debonded therefrom); (b) bubbling between the carrier and the thin sheet (as determined by visual inspection with the naked eye—samples were photographed before and after the processing, and then compared, failure was determined to have occurred if defects increased in size by dimensions visible to the unaided eye); or (c) increased adhesion between the carrier and the thin sheet whereby such increased adhesion prevents debonding (by insertion of a razor blade between the thin sheet and carrier, and/or by sticking a piece of Kapton™ tape, 1" wide×6" long with 2-3" attached to 100 mm square thin glass (K102 series from Saint Gobain Performance Plastic, Hoosik N.Y.) to the thin sheet and pulling on the tape) of the thin sheet from the carrier without damaging the thin sheet or the carrier, wherein a failure was deemed to have occurred if there was damage to the thin sheet or carrier upon attempting to separate them, or if the thin sheet and carrier could not be debonded by performance of either of the debonding methods. Additionally, after the thin sheet was bonded with the carrier, and prior to the thermal cycling, debonding tests were performed on representative samples to determine that a particular material, including any associated surface treatment, did allow for debonding of the thin sheet from the carrier prior to the temperature cycling. In the tables below, a notation of "P" in the "400° C." column indicates that the sample did not fail as per the foregoing criteria.

(4) Temperature to 600° C. testing. 600° C. process compatibility testing was performed using an Alwin21 Accuthermo610 RTP. A carrier with a thin sheet was heated in a chamber cycled from room temperature to 600° C. at 9.5° C./min, held at 600° C. for 600 seconds, and then cooled at 1° C./min to 300° C. The carrier and thin sheet were then allowed to cool to room temperature. Failure, as indicated by a notation of "F" in the "600° C." column of the tables below, was deemed to have occurred if there was: (a) a loss of adhesion between the carrier and the thin sheet (by visual inspection with the naked eye, wherein failure was deemed to have occurred if the thin sheet had fallen off of the carrier or was partially debonded therefrom); (b) bubbling between the carrier and the thin sheet (as determined by visual inspection with the naked eye—samples were photographed before and after the processing, and then compared, failure was determined to have occurred if defects increased in size by dimensions visible to the unaided eye); or (c) increased adhesion between the carrier and the thin sheet whereby such increased adhesion prevents debonding (by insertion of a razor blade between the thin sheet and carrier, and/or by sticking a piece of Kapton™ tape as described above to the thin sheet and pulling on the tape) of the thin sheet from the carrier without damaging the thin sheet or the carrier, wherein a failure was deemed to have occurred if there was damage to the thin sheet or carrier upon attempting to separate them, or if the thin sheet and carrier could not be debonded by performance of either of the debonding methods. Additionally, after the thin sheet was bonded with the carrier, and prior to the thermal cycling, debonding tests were performed on representative samples to determine that a particular material, and any associated surface treatment, did allow for debonding of the thin sheet from the carrier prior to the temperature cycling. In the tables below, a notation of "P" in the "600° C." column indicates that the sample did not fail as per the foregoing criteria.

(5) Ultrasonic testing. Ultrasonic compatibility testing was performed by cleaning the article in a four tank line, wherein the article was processed in each of the tanks sequentially from tank #1 to tank #4. Tank dimensions, for each of the four tanks, were 18.4"L×10"W×15"D. Two cleaning tanks (#1 and #2) contained 1% Semiclean KG available from Yokohama Oils and Fats Industry Co Ltd., Yokohama Japan in DI water at 50° C. The cleaning tank #1 was agitated with a NEY prosonik 2 104 kHz ultrasonic generator (available from Blackstone-NEY Ultrasonics, Jamestown, N.Y.), and the cleaning tank #2 was agitated with a NEY prosonik 2 104 kHz ultrasonic generator. Two rinse tanks (tank #3 and tank #4) contained DI water at 50° C. The rinse tank #3 was agitated by NEY sweepsonik 2D 72 kHz ultrasonic generator and the rinse tank #4 was agitated by a NEY sweepsonik 2D 104 kHz ultrasonic generator. The processes were carried out for 10 min in each of the tanks #1-4, followed by spin rinse drying (SRD) after the sample was removed from tank #4. Failure, as indicated by a notation of "F" in the "Ultrasonic" column of the tables below, was deemed to have occurred if there was: (a) a loss of adhesion between the carrier and the thin sheet (by visual inspection with the naked eye, wherein failure was deemed to have occurred if the thin sheet had fallen off of the carrier or was partially debonded therefrom); (b) bubbling between the carrier and the thin sheet (as determined by visual inspection with the naked eye—samples were photographed before and after the processing, and then compared, failure was determined to have occurred if defects increased in size by dimensions visible to the unaided eye); or (c) formation of other gross defects (as determined by visual inspection with optical microscope at 50×, wherein failure was deemed to have occurred if there were particles trapped between the thin glass and carrier that were not observed before; or (d) penetration of water under the thin sheet (as determined by visual inspection with an optical microscope at 50×, wherein failure was determined to have occurred if liquid or residue was observable. In the tables below, a notation of "P" in the "Ultrasonic" column indicates that the sample did not fail as per the foregoing criteria. Additionally, in the tables below, a blank in the "Ultrasonic" column indicates that the sample was not tested in this manner.

Preparation of Bonding Surfaces Via Hydroxyl Reduction by Heating

The benefit of modifying one or more of the bonding surfaces 14, 24 with a surface modification layer 30 so the article 2 is capable of successfully undergoing FPD processing (i.e., where the thin sheet 20 remains bonded to the carrier 10 during processing, and yet may be separated from the carrier 10 after processing, including high temperature processing) was demonstrated by processing articles 2 having glass carriers 10 and thin glass sheets 20 without a surface modification layer 30 therebetween. Specifically, first there was tried preparation of the bonding surfaces 14, 24 by heating to reduce hydroxyl groups, but without a surface modification layer 30. The carriers 10 and thin sheets 20 were cleaned, the bonding surfaces 14 and 24 were bonded to one another, and then the articles 2 were tested. A typical cleaning process for preparing glass for bonding is the SC1 cleaning process where the glass is cleaned in a dilute hydrogen peroxide and base (commonly ammonium hydroxide, but tetramethylammonium hydroxide solutions for example JT Baker JTB-100 or JTB-111 may also be used). Cleaning removes particles from the bonding surfaces, and makes the surface energy known, i.e., it provides a base-line of surface energy. The manner of cleaning need not be SC1, other types of cleaning may be used, as the type of cleaning is likely to have only a very minor effect on the silanol groups on the surface. The results for various tests are set forth below in Table 1.

A strong but separable initial, room temperature or van der Waal and/or Hydrogen-bond was created by simply cleaning a thin glass sheet of 100 mm square×100 micron thick, and a glass carrier 150 mm diameter single mean flat (SMF) wafer 0.50 or 0.63 mm thick, each comprising Eagle XG® display glass (an alkali-free, alumino-boro-silicate glass, having an average surface roughness Ra on the order of 0.2 nm, available from Corning Incorporated, Corning, N.Y.). In this example, glass was cleaned 10 min in a 65° C. bath of 40:1:2 DI water:JTB-111:Hydrogen peroxide. The thin glass or glass carrier may or may not have been annealed in nitrogen for 10 min at 400° C. to remove residual water—the notation "400° C." in the "Carrier" column or the "Thin Glass" column in Table 1 below indicates that the sample was annealed in nitrogen for 10 minutes at 400° C. FPD process compatibility testing demonstrates this SC1-SC1 initial, room temperature, bond is mechanically strong enough to pass vacuum, SRD and ultrasonic testing. However, heating at 400° C. and above created a permanent bond between the thin glass and carrier, i.e., the thin glass sheet could not be removed from the carrier without damaging either one or both of the thin glass sheet and carrier. And this was the case even for Example 1c, wherein each of the carrier and the thin glass had an annealing step to reduce the concentration of surface hydroxyls. Accordingly, the above-described preparation of the bonding surfaces 14, 24 via heating alone and then bonding of the carrier 10 and the thin sheet 12, without a surface modification layer 30, is not a suitable controlled bond for FPD processes wherein the temperature will be ≥400° C.

TABLE 1 process compatibility testing of SC1-treated glass bonding surfaces

| Example | Carrier | Thin Glass | Vacuum | SRD | 400 C. | 600 C. | Ultrasonic |
|---|---|---|---|---|---|---|---|
| 1a | SC1 | SC1 | P | P | F | F | P |
| 1b | SC1, 400 C. | SC1 | P | P | F | F | P |
| 1c | SC1, 400 C. | SC1, 400 C. | P | P | F | F | P |

Preparation of Bonding Surfaces by Hydroxyl Reduction and Surface Modification Layer Hydroxyl reduction, as by heat treatment for example, and a surface modification layer 30 may be used together to control the interaction of bonding surfaces 14, 24. For example, the bonding energy (both van der Waals and/or Hydrogen-bonding at room temperature due to the polar/dispersion energy components, and covalent bonding at high temperature due to the covalent energy component) of the bonding surfaces 14, 24 can be controlled so as to provide varying bond strength from that wherein room-temperature bonding is difficult, to that allowing easy room-temperature bonding and separation of the bonding surfaces after high temperature processing, to that which—after high temperature processing—prevents the surfaces from separating without damage. In some applications, it may be desirable to have no, or very weak bonding (as when the surfaces are in a "non-bonding" region, as a "non-bonding" region is described in the thin sheet/carrier concept of US '727, and as described below). In other applications, for example providing a re-usable carrier for FPD processes and the like (wherein process temperatures ≥500° C., or ≥600° C., and up to 650° C., may be achieved), it is desirable to have sufficient van der Waals and/or Hydrogen-bonding, at room temperature to initially put the thin sheet and carrier together, and yet prevent or limit high temperature covalent bonding. For still other applications, it may be desirable to have sufficient room temperature boding to initially put the thin sheet and carrier together, and also to develop strong covalent bonding at high temperature (as when the surfaces are in a "bonding region", as "bonding region" is described in the thin sheet/carrier concept of US '727, and as discussed below). Although not wishing to be bound by theory, in some instances the surface modification layer may be used to control room temperature bonding by which the thin sheet and carrier are initially put together, whereas the reduction of hydroxyl groups on the surface (as by heating the surface, or by reaction of the hydroxyl groups with the surface modification layer, for example) may be used to control the covalent bonding, particularly that at high temperatures.

A material for the surface modification layer 30 may provide a bonding surface 14, 24 with an energy (for example, and energy <40 mJ/m$^2$, as measured for one surface, and including polar and dispersion components) whereby the surface produces only weak bonding. In one example, hexamethyldisilazane (HMDS) may be used to create this low energy surface by reacting with the surface hydroxyls to leave a trimethylsilyl (TMS) terminated surface. HMDS as a surface modification layer may be used together with surface heating to reduce the hydroxyl concentration to control both room temperature and high temperature bonding. By choosing a suitable bonding surface preparation for each bonding surface 14, 24, there can be achieved articles having a range of capabilities. More specifically, of interest to providing a reusable carrier for LTPS processing, there can be achieved a suitable bond between a thin glass sheet 20 and a glass carrier 10 so as to survive (or pass) each of the vacuum SRD, 400° C. (parts a and c), and 600° C. (parts a and c), processing tests.

In one example, following SC1 cleaning by HMDS treatment of both thin glass and carrier creates a weakly bonded surface which is challenging to bond at room temperature with van der Waals (and/or hydrogen bonding) forces. Mechanical force is applied to bond the thin glass to the carrier. As shown in example 2a of Table 2, this bonding is sufficiently weak that deflection of the carrier is observed in vacuum testing and SRD processing, bubbling (likely due to outgassing) was observed in 400° C. and 600° C. thermal processes, and particulate defects were observed after ultrasonic processing.

In another example, HMDS treatment of just one surface (carrier in the example cited) creates stronger room temperature adhesion which survives vacuum and SRD processing. However, thermal processes at 400° C. and above permanently bonded the thin glass to the carrier. This is not unexpected as the maximum surface coverage of the trimethylsilyl groups on silica has been calculated by Sindorf and Maciel in J. Phys. Chem. 1982, 86, 5208-5219 to be 2.8/nm$^2$ and measured by Suratwala et. al. in Journal of Non-Crystalline Solids 316 (2003) 349-363 as 2.7/nm$^2$, vs. a hydroxyl concentration of 4.6-4.9/nm$^2$ for fully hydroxylated silica. That is, although the trimethylsilyl groups do bond with some surface hydroxyls, there will remain some un-bonded hydroxyls. Thus one would expect condensation of surface silanol groups to permanently bond the thin glass and carrier given sufficient time and temperature.

Figure 4:
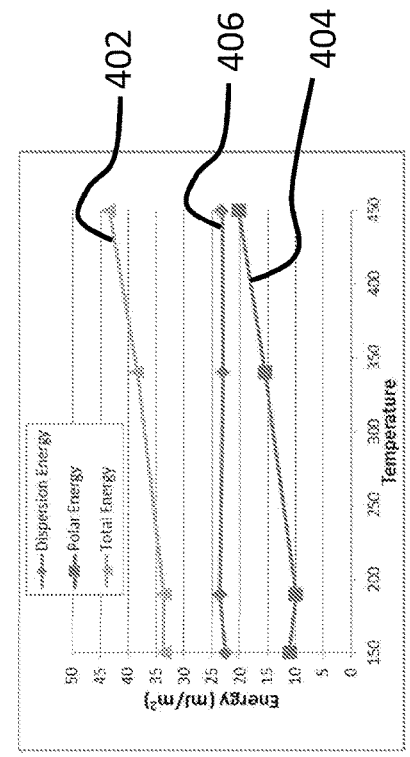
FIG. 4 is a graph of the surface energy of an SC1-cleaned sheet of glass as a function annealing temperature.

A varied surface energy can be created by heating the glass surface to reduce the surface hydroxyl concentration prior to HMDS exposure, leading to an increased polar component of the surface energy. This both decreases the driving force for formation of covalent Si—O—Si bonds at high temperature and leads to stronger room-temperature bonding, for example, van der Waal (and/or hydrogen) bonding. FIG. 4 shows the surface energy of an Eagle XG® display glass carrier after annealing, and after HMDS treatment. Increased annealing temperature prior to HMDS exposure increases the total (polar and dispersion) surface energy (line 402) after HMDS exposure by increasing the polar contribution (line 404). It is also seen that the dispersion contribution (line 406) to the total surface energy remains largely unchanged by the heat treatment. Although not wishing to be bound by theory, increasing the polar component of, and thereby the total, energy in the surface after HMDS treatment appears to be due to there being some exposed glass surface areas even after HMDS treatment because of sub-monolayer TMS coverage by the HMDS.

In example 2b, the thin glass sheet was heated at a temperature of 150° C. in a vacuum for one hour prior to bonding with the non-heat-treated carrier having a coating of HMDS. This heat treatment of the thin glass sheet was not sufficient to prevent permanent bonding of the thin glass sheet to the carrier at temperatures ≥400° C.

As shown in examples 2c-2e of Table 2, varying the annealing temperature of the glass surface prior to HMDS exposure can vary the bonding energy of the glass surface so as to control bonding between the glass carrier and the thin glass sheet.

In example 2c, the carrier was annealed at a temperature of 190° C. in vacuum for 1 hour, followed by HMDS exposure to provide surface modification layer 30. Additionally, the thin glass sheet was annealed at 450° C. in a vacuum for 1 hour before bonding with the carrier. The resulting article survived the vacuum, SRD, and 400° C. tests (parts a and c, but did not pass part b as there was increased bubbling), but failed the 600° C. test. Accordingly, although there was increased resistance to high temperature bonding as compared with example 2b, this was not sufficient to produce an article for processing at temperatures ≥600° C. (for example LTPS processing) wherein the carrier is reusable.

In example 2d, the carrier was annealed at a temperature of 340° C. in a vacuum for 1 hour, followed by HMDS exposure to provide surface modification layer 30. Again, the thin glass sheet was annealed at 450° C. for 1 hour in a vacuum before bonding with the carrier. The results were similar to those for example 2c, wherein the article survived the vacuum, SRD, and 400° C. tests (parts a and c, but did not pass part b as there was increased bubbling), but failed the 600° C. test.

As shown in example 2e, annealing both thin glass and carrier at 450° C. in vacuum for 1 hr, followed by HMDS exposure of the carrier, and then bonding of the carrier and thin glass sheet, improves the temperature resistance to permanent bonding. An anneal of both surfaces to 450° C. prevents permanent bonding after RTP annealing at 600° C. for 10 min, that is, this sample passed the 600° C. processing test (parts a and c, but did not pass part b as there was increased bubbling; a similar result was found for the 400° C. test).

TABLE 2 process compatibility testing of HMDS surface modification layers

| Example | Carrier | Thin Glass | Vacuum | SRD | 400 C. | 600 C. | Ultrasonic |
|---|---|---|---|---|---|---|---|
| 2a | SC1, HMDS | SC1, HMDS | F | F | P | P | F |
| 2b | SC1, HMDS | SC1, 150 C. | P | P | F | F | |
| 2c | SC1, 190 C., HMDS | SC1, 450 C. | P | P | P | F | |
| 2d | SC1, 340 C., HMDS | SC1, 450 C. | P | P | P | F | |
| 2e | SC1, 450 C., HMDS | SC1, 450 C. | P | P | P | P | |

In Examples 2a to 2e above, each of the carrier and the thin sheet were Eagle XG® glass, wherein the carrier was a 150 mm diameter SMF wafer 630 microns thick and the thin sheet was 100 mm square 100 microns thick The HMDS was applied by pulse vapor deposition in a YES-5 HMDS oven (available from Yield Engineering Systems, San Jose Calif.) and was one atomic layer thick (i.e., about 0.2 to 1 nm), although the surface coverage may be less than one monolayer, i.e., some of the surface hydroxyls are not covered by the HMDS as noted by Maciel and discussed above. Because of the small thickness in the surface modification layer, there is little risk of outgassing which can cause contamination in the device fabrication. Further, because the surface modification layer did not appear to degrade, again, there is even less risk of outgassing. Also, as indicated in Table 2 by the "SC1" notation, each of the carriers and thin sheets were cleaned using an SC1 process prior to heat treating or any subsequent HMDS treatment.

A comparison of example 2a with example 2b shows that the bonding energy between the thin sheet and the carrier can be controlled by varying the number of surfaces which include a surface modification layer. And controlling the bonding energy can be used to control the bonding force between two bonding surfaces. Also, a comparison of examples 2b-2e, shows that the bonding energy of a surface can be controlled by varying the parameters of a heat treatment to which the bonding surface is subjected before application of a surface modification material. Again, the heat treatment can be used to reduce the number of surface hydroxyls and, thus, control the degree of covalent bonding, especially that at high temperatures.

Other materials, that may act in a different manner to control the surface energy on a bonding surface, may be used for the surface modification layer 30 so as to control the room temperature and high temperature bonding forces between two surfaces. For example, a reusable carrier can also be created if one or both bonding surfaces are modified to create a moderate bonding force with a surface modification layer that either covers, or sterically hinders species for example hydroxyls to prevent the formation at elevated temperature of strong permanent covalent bonds between carrier and thin sheet. One way to create a tunable surface energy, and cover surface hydroxyls to prevent formation of covalent bonds, is deposition of plasma polymer films, for example fluoropolymer films. Plasma polymerization deposits a thin polymer film under atmospheric or reduced pressure and plasma excitation (DC or RF parallel plate, Inductively Coupled Plasma (ICP) Electron Cyclotron Resonance (ECR) downstream microwave or RF plasma) from source gases for example fluorocarbon sources (including $CF_4$, $CHF_3$, $C_2F_6$, $C_3F_6$, $C_2F_2$, $CH_3F$, $C_4F_8$, chlorofluoro carbons, or hydrochlorofluoro carbons), hydrocarbons for example alkanes (including methane, ethane, propane, butane), alkenes (including ethylene, propylene), alkynes (including acetylene), and aromatics (including benzene, toluene), hydrogen, and other gas sources for example $SF_6$. Plasma polymerization creates a layer of highly cross-linked material. Control of reaction conditions and source gases can be used to control the film thickness, density, and chemistry to tailor the functional groups to the desired application.

Figure 5:
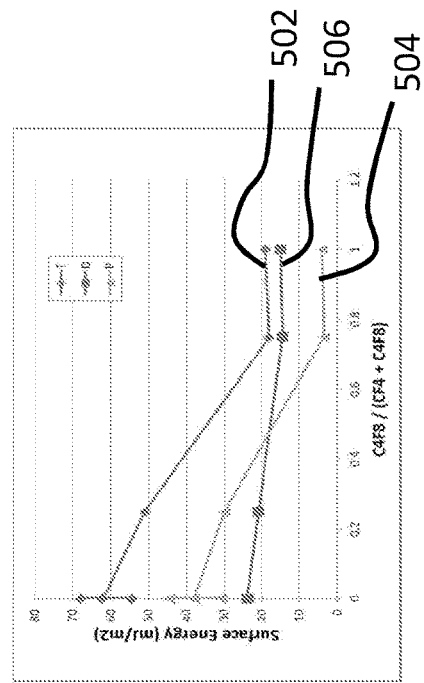
FIG. 5 is a graph of the surface energy of a thin fluoropolymer film deposited on a sheet of glass as a function of the percentage of one of the constituent materials from which the film was made.

FIG. 5 shows the total (line 502) surface energy (including polar (line 504) and dispersion (line 506) components) of plasma polymerized fluoropolymer (PPFP) films deposited from $CF_4$-$C_4F_8$ mixtures with an Oxford ICP380 etch tool (available from Oxford Instruments, Oxfordshire UK). The films were deposited onto a sheet of Eagle XG® glass, and spectroscopic ellipsometry showed the films to be 1-10 nm thick. As seen from FIG. 5, glass carriers treated with plasma polymerized fluoropolymer films containing less than 40% $C_4F_8$ exhibit a surface energy >40 mJ/m$^2$ and produce controlled bonding between the thin glass and carrier at room temperature by van der Waal or hydrogen bonding. Facilitated bonding is observed when initially bonding the carrier and thin glass at room temperature. That is, when placing the thin sheet onto the carrier, and pressing them together at a point, a wave front travels across the carrier, but at a lower speed than is observed for SC1 treated surfaces having no surface modification layer thereon. The controlled bonding is sufficient to withstand all standard FPD processes including vacuum, wet, ultrasonic, and thermal processes up to 600° C., that is this controlled bonding passed the 600° C. processing test without movement or delamination of the thin glass from the carrier. De-bonding was accomplished by peeling with a razor blade and/or Kapton™ tape as described above. The process compatibility of two different PPFP films (deposited as described above) is shown in Table 3. PPFP 1 of example 3a was formed with $C_4F_8/(C_4F_8+CF_4)=0$, that is, formed with $CF_4/H_2$ and not $C_4F_8$, and PPFP 2 of example 3b was deposited with $C_4F_8/(C_4F_8+CF_4)=0.38$. Both types of PPFP films survived the vacuum, SRD, 400° C. and 600° C. processing tests. However, delamination is observed after 20 min of ultrasonic cleaning of PPFP 2 indicating insufficient adhesive force to withstand such processing. Nonetheless, the surface modification layer of PPFP2 may be useful for some applications, as where ultrasonic processing is not necessary.

TABLE 3 process compatibility testing of PPFP surface modification layers

| Example | Carrier | Thin Glass | Vacuum | SRD | 400 C. | 600 C. | Ultrasonic |
|---------|---------|------------|--------|-----|--------|--------|------------|
| 3a | PPFP 1 | SC1, 150 C. | P | P | P | P | P |
| 3b | PPFP2 | SC1, 150 C. | P | P | P | P | F |

In Examples 3a and 3b above, each of the carrier and the thin sheet were Eagle XG® glass, wherein the carrier was a 150 mm diameter SMF wafer 630 microns thick and the thin sheet was 100 mm square 100 microns thick. Because of the small thickness in the surface modification layer, there is little risk of outgassing which can cause contamination in the device fabrication. Further, because the surface modification layer did not appear to degrade, again, there is even less risk of outgassing. Also, as indicated in Table 3, each of the thin sheets was cleaned using an SC1 process prior to heat treating at 150° C. for one hour in a vacuum.

Still other materials, that may function in a different manner to control surface energy, may be used as the surface modification layer to control the room temperature and high temperature bonding forces between the thin sheet and the carrier. For example, a bonding surface that can produce controlled bonding can be created by silane treating a glass carrier and/or glass thin sheet. Silanes are chosen so as to produce a suitable surface energy, and so as to have sufficient thermal stability for the application. The carrier or thin glass to be treated may be cleaned by a process for example O2 plasma or UV-ozone, and SC1 or standard clean two (SC2, as is known in the art) cleaning to remove organics and other impurities (metals, for example) that would interfere with the silane reacting with the surface silanol groups. Washes based on other chemistries may also be used, for example, HF, or H2SO4 wash chemistries. The carrier or thin glass may be heated to control the surface hydroxyl concentration prior to silane application (as discussed above in connection with the surface modification layer of HMDS), and/or may be heated after silane application to complete silane condensation with the surface hydroxyls. The concentration of unreacted hydroxyl groups after silanization may be made low enough prior to bonding as to prevent permanent bonding between the thin glass and carrier at temperatures ≥400° C., that is, to form a controlled bond. This approach is described below.

Example 4a

A glass carrier with its bonding surface O2 plasma and SC1 treated was then treated with 1% dodecyltriethoxysilane (DDTS) in toluene, and annealed at 150° C. in vacuum for 1 hr to complete condensation. DDTS treated surfaces exhibit a surface energy of 45 mJ/m². As shown in Table 4, a glass thin sheet (having been SC1 cleaned and heated at 400° C. in a vacuum for one hour) was bonded to the carrier bonding surface having the DDTS surface modification layer thereon. This article survived wet and vacuum process tests but did not survive thermal processes over 400° C. without bubbles forming under the carrier due to thermal decomposition of the silane. This thermal decomposition is expected for all linear alkoxy and chloro alkylsilanes $R1_xSi(OR2)_y(Cl)_z$ where x=1 to 3, and y+z=4−x except for methyl, dimethyl, and trimethyl silane (x=1 to 3, R1=CH$_3$) which produce coatings of good thermal stability.

Example 4b

A glass carrier with its bonding surface O2 plasma and SC1 treated was then treated with 1% 3,3,3, trifluoropropyltritheoxysilane (TFTS) in toluene, and annealed at 150° C. in vacuum for 1 hr to complete condensation. TFTS treated surfaces exhibit a surface energy of 47 mJ/m². As shown in Table 4, a glass thin sheet (having been SC1 cleaned and then heated at 400° C. in a vacuum for one hour) was bonded to the carrier bonding surface having the TFTS surface modification layer thereon. This article survived the vacuum, SRD, and 400° C. process tests without permanent bonding of the glass thin sheet to the glass carrier. However, the 600° C. test produced bubbles forming under the carrier due to thermal decomposition of the silane. This was not unexpected because of the limited thermal stability of the propyl group. Although this sample failed the 600° C. test due to the bubbling, the material and heat treatment of this example may be used for some applications wherein bubbles and the adverse effects thereof, for example reduction in surface flatness, or increased waviness, can be tolerated.

Example 4c

A glass carrier with its bonding surface O2 plasma and SC1 treated was then treated with 1% phenyltriethoxysilane (PTS) in toluene, and annealed at 200° C. in vacuum for 1 hr to complete condensation. PTS treated surfaces exhibit a surface energy of 54 mJ/m². As shown in Table 4, a glass thin sheet (having been SC1 cleaned and then heated at 400° C. in a vacuum for one hour) was bonded to the carrier bonding surface having the PTS surface modification layer. This article survived the vacuum, SRD, and thermal processes up to 600° C. without permanent bonding of the glass thin sheet with the glass carrier.

Example 4d

A glass carrier with its bonding surface O2 plasma and SC1 treated was then treated with 1% diphenyldiethoxysilane (DPDS) in toluene, and annealed at 200° C. in vacuum for 1 hr to complete condensation. DPDS treated surfaces exhibit a surface energy of 47 mJ/m². As shown in Table 4, a glass thin sheet (having been SC1 cleaned and then heated at 400° C. in a vacuum for one hour) was bonded to the carrier bonding surface having the DPDS surface modification layer. This article survived the vacuum and SRD tests, as well as thermal processes up to 600° C. without permanent bonding of the glass thin sheet with the glass carrier Example 4e A glass carrier having its bonding surface O2 plasma and SC1 treated was then treated with 1% 4-pentafluorophenyltriethoxysilane (PFPTS) in toluene, and annealed at 200° C. in vacuum for 1 hr to complete condensation. PFPTS treated surfaces exhibit a surface energy of 57 mJ/m². As shown in Table 4, a glass thin sheet (having been SC1 cleaned and then heated at 400° C. in a vacuum for one hour) was bonded to the carrier bonding surface having the PFPTS surface modification layer. This article survived the vacuum and SRD tests, as well as thermal processes up to 600° C. without permanent bonding of the glass thin sheet with the glass carrier.

TABLE 4 process compatibility testing of silane surface modification layers

| Example | Carrier | Thin Glass | Vacuum | SRD | 400 C. | 600 C. |
|---|---|---|---|---|---|---|
| 4a | SC1, DDTS | SC1, 400 C. | P | P | F | F |
| 4b | SC1, TFTS | SC1, 400 C. | P | P | P | F |
| 4c | SC1, PTS | SC1, 400 C. | P | P | P | P |
| 4d | SC1, DPDS | SC1, 400 C. | P | P | P | P |
| 4e | SC1, PFPTS | SC1, 400 C. | P | P | P | P |

In Examples 4a to 4e above, each of the carrier and the thin sheet were Eagle XG® glass, wherein the carrier was a 150 mm diameter SMF wafer 630 microns thick and the thin sheet was 100 mm square 100 microns thick. The silane layers were self-assembled monolayers (SAM), and thus were on the order of less than about 2 nm thick. In the above examples, the SAM was created using an organosilane with an aryl or alkyl non-polar tail and a mono, di, or tri-alkoxide head group. These react with the silnaol surface on the glass to directly attach the organic functionality. Weaker interactions between the non-polar head groups organize the organic layer. Because of the small thickness in the surface modification layer, there is little risk of outgassing which can cause contamination in the device fabrication. Further, because the surface modification layer did not appear to degrade in examples 4c, 4d, and 4e, again, there is even less risk of outgassing. Also, as indicated in Table 4, each of the glass thin sheets was cleaned using an SC1 process prior to heat treating at 400° C. for one hour in a vacuum.

As can be seen from a comparison of examples 4a-4e, controlling surface energy of the bonding surfaces to be above 40 mJ/m$^2$ so as to facilitate the initial room temperature bonding is not the only consideration to creating a controlled bond that will withstand FPD processing and still allow the thin sheet to be removed from the carrier without damage. Specifically, as seen from examples 4a-4e, each carrier had a surface energy above 40 mJ/m$^2$, which facilitated initial room temperature bonding so that the article survived vacuum and SRD processing. However, examples 4a and 4b did not pass 600° C. processing test. As noted above, for certain applications, it is also important for the bond to survive processing up to high temperatures (for example, ≥400° C., ≥500° C., or ≥600° C., up to 650° C., as appropriate to the processes in which the article is designed to be used) without degradation of the bond to the point where it is insufficient to hold the thin sheet and carrier together, and also to control the covalent bonding that occurs at such high temperatures so that there is no permanent bonding between the thin sheet and the carrier. As shown by the examples in Table 4, aromatic silanes, in particular phenyl silanes, are useful for providing a controlled bond that will facilitate initial room temperature bonding, and that will withstand FPD processing and still allow the thin sheet to be removed from the carrier without damage.

The above-described separation in examples 4, 3, and 2, is performed at room temperature without the addition of any further thermal or chemical energy to modify the bonding interface between the thin sheet and carrier. The only energy input is mechanical pulling and/or peeling force.

The materials described above in examples 3 and 4 can be applied to the carrier, to the thin sheet, or to both the carrier and thin sheet surfaces that will be bonded together.

Uses of Controlled Bonding
To Provide a Controlled Bonding Area

One use of controlled bonding via surface modification layers (including materials and the associated bonding surface heat treatments) is to provide a controlled bonding area, between a glass carrier and a glass thin sheet. More specifically, with the use of the surface modification layers an area of controlled bonding can be formed wherein a sufficient separation force can separate the thin sheet portion from the carrier without damage to either the thin sheet or the carrier caused by the bond, yet there is maintained throughout processing a sufficient bonding force to hold the thin sheet relative to the carrier. With reference to FIG. 6, a glass thin sheet 20 may be bonded to a glass carrier 10 by a bonded area 40. In the bonded area 40, the carrier 10 and thin sheet 20 are covalently bonded to one another so that they act as a monolith. Additionally, there are controlled bonding areas 50 having perimeters 52, wherein the carrier 10 and thin sheet 20 are connected, but may be separated from one another, even after high temperature processing, e.g. processing at temperatures ≥600° C. Although ten controlled bonding areas 50 are shown in FIG. 6, any suitable number, including one, may be provided. The surface modification layers 30, including the materials and bonding surface heat treatments, as exemplified by the examples 2a, 2e, 3a, 3b, 4c, 4d, and 4e, above, may be used to provide the controlled bonding areas 50 between the carrier 10 and the thin sheet 20. Specifically, these surface modification layers may be formed within the perimeters 52 of controlled bonding areas 50 either on the carrier 10 or on the thin sheet 20. Accordingly, when the article 2 is processed at high temperature, either to form covalent bonding in the bonding area 40 or during device processing, there can be provided a controlled bond between the carrier 10 and the thin sheet 20 within the areas bounded by perimeters 52 whereby a separation force may separate (without catastrophic damage to the thin sheet or carrier) the thin sheet and carrier in this region, yet the thin sheet and carrier will not delaminate during processing, including ultrasonic processing. The controlled bonding of the present application, as provided by the surface modification layers and any associated heat treatments, is thus able to improve upon the carrier concept in US '727. Specifically, Although the carriers of US '727 were demonstrated to survive FPD processing, including high temperature processing ≥about 600° C. with their bonded peripheries and non-bonded center regions, ultrasonic processes for example wet cleans and resist strip processing remained challenging. Specifically, pressure waves in the solution were seen to induce sympathic vibrations in the thin glass in the non-bonding region (as non-bonding was described in US '727), as there was little or no adhesive force bonding the thin glass and carrier in that region. Standing waves in the thin glass can be formed, wherein these waves may cause vibrations that can lead to breakage of the thin glass at the interface between the bonded and non-bonded regions if the ultrasonic agitation is of sufficient intensity. This problem can be eliminated by minimizing the gap between the thin glass and the carrier and by providing sufficient adhesion, or controlled bonding between the carrier 20 and thin glass 10 in these areas 50. Surface modification layers (including materials and any associated heat treatments as exemplified by examples 2a, 2e, 3a, 3b, 4c, 4d, and 4e) of the bonding surfaces control the bonding energy so as to provide a sufficient bond between the thin sheet 20 and carrier 10 to avoid these unwanted vibrations in the controlled bonding region.

Then, during extraction of the desired parts 56 having perimeters 57, the portions of thin sheet 20 within the perimeters 52 may simply be separated from the carrier 10 after processing and after separation of the thin sheet along perimeters 57. Because the surface modification layers control bonding energy to prevent permanent bonding of the thin sheet with the carrier, they may be used for processes wherein temperatures are ≥600° C. Of course, although these surface modification layers may control bonding surface energy during processing at temperatures ≥600° C., they may also be used to produce a thin sheet and carrier combination that will withstand processing at lower temperatures, and may be used in such lower temperature applications. Moreover, where the thermal processing of the article will not exceed 400° C., surface modification layers as exemplified by the examples 2c, 2d, 4b may also be used—in some instances, depending upon the other process requirements—in this same manner to control bonding surface energy.

To Provide a Bonding Area

A second use of controlled bonding via surface modification layers (including materials and any associated bonding surface heat treatment) is to provide a bonding area between a glass carrier and a glass thin sheet. With reference to FIG. 6, a glass thin sheet 20 may be bonded to a glass carrier 10 by a bonded area 40.

In one embodiment of the second use, the bonded area 40, the carrier 10 and thin sheet 20 may be covalently bonded to one another so that they act as a monolith. Additionally, there are controlled bonding areas 50 having perimeters 52, wherein the carrier 10 and thin sheet 20 are bonded to one another sufficient to withstand processing, and still allow separation of the thin sheet from the carrier even after high temperature processing, e.g. processing at temperatures ≥600° C. Accordingly, surface modification layers 30 (including materials and bonding surface heat treatments) as exemplified by the examples 1a, 1b, 1c, 2b, 2c, 2d, 4a, and 4b above, may be used to provide the bonding areas 40 between the carrier 10 and the thin sheet 20. Specifically, these surface modification layers and heat treatments may be formed outside of the perimeters 52 of controlled bonding areas 50 either on the carrier 10 or on the thin sheet 20. Accordingly, when the article 2 is processed at high temperature, or is treated at high temperature to form covalent bonds, the carrier and the thin sheet 20 will bond to one another within the bonding area 40 outside of the areas bounded by perimeters 52. Then, during extraction of the desired parts 56 having perimeters 57, when it is desired to dice the thin sheet 20 and carrier 10, the article may be separated along lines 5 because these surface modification layers and heat treatments covalently bond the thin sheet 20 with the carrier 10 so they act as a monolith in this area. Because the surface modification layers provide permanent covalent bonding of the thin sheet with the carrier, they may be used for processes wherein temperatures are ≥600° C. Moreover, where the thermal processing of the article, or of the initial formation of the bonding area 40, will be ≥400° C. but less than 600° C., surface modification layers, as exemplified by the materials and heat treatments in example 4a may also be used in this same manner.

In a second embodiment of the second use, in the bonded area 40, the carrier 10 and thin sheet 20 may be bonded to one another by controlled bonding via various surface modification layers described above. Additionally, there are controlled bonding areas 50, having perimeters 52, wherein the carrier 10 and thin sheet 20 are bonded to one another sufficient to withstand processing, and still allow separation of the thin sheet from the carrier even after high temperature processing, e.g. processing at temperatures ≥600° C. Accordingly, if processing will be performed at temperatures up to 600° C., and it is desired not to have a permanent or covalent bond in area 40, surface modification layers 30 (including materials and bonding surface heat treatments) as exemplified by the examples 2e, 3a, 3b, 4c, 4d, and 4e above, may be used to provide the bonding areas 40 between the carrier 10 and the thin sheet 20. Specifically, these surface modification layers and heat treatments may be formed outside of the perimeters 52 of controlled bonding areas 50, and may be formed either on the carrier 10 or on the thin sheet 20. The controlled bonding areas 50 may be formed with the same, or with a different, surface modification layer as was formed in the bonding area 40. Alternatively, if processing will be performed at temperatures only up to 400° C., and it is desired not to have a permanent or covalent bond in area 40, surface modification layers 30 (including materials and bonding surface heat treatments) as exemplified by the examples 2c, 2d, 2e, 3a, 3b, 4b, 4c, 4d, 4e, above, may be used to provide the bonding areas 40 between the carrier 10 and the thin sheet 20.

Instead of controlled bonding in areas 50, there may be non-bonding regions in areas 50, wherein the non-bonding regions may be areas of increased surface roughness as described in US '727, or may be provided by surface modification layers as exemplified by example 2a.

Simplified Manner of Making an Article

A third use of various ones of the above-described surface modification layers, including materials and their associated surface treatments, may be used to provide a simplified manner of making an article having a covalently bonded perimeter, i.e., one having a hermetic seal around its perimeter so as to prevent ingress of fluids that may undesirably contaminate downstream processes. Alternatively, or in addition to, a covalently bonded perimeter, covalent bonding between the carrier and thin sheet may be desired in certain areas of the article, and not desired in other areas of the article (wherein controlled bonding may be desired to allow sections of the thin sheet to be removed from the carrier without damage to either). Again, various ones of the above-described surface modification layers, including materials and their associated surface treatments, may be used to provide such patterned covalent bonding areas, and patterned controlled bonding areas.

First Embodiment of the Third Use

A first embodiment of making an article 2 having a bonding area 40 that includes permanent covalent bonding, and a controlled bonding area 50, will now be described with reference to FIGS. 7-10. For example, to make article 2, a surface modification layer 30 is provided on a glass carrier 10. For the sake of ease in illustration the surface modification layer 30 is shown and described as being provided on the carrier 10. However, a surface modification layer 30 may be provided on the carrier 10, the glass thin sheet 20, or both of them. When provided on both the carrier 10 and the thin sheet 20, the surface modification layers are preferably of the same material, although they need not be. The surface modification layer 30 is provided over the entire bonding surface 14 of the carrier 10. The surface modification layer may be provided on the carrier 10 according to any one of the materials and surface treatments as set forth in Examples 2a (as when ultrasonic processing is not required or its effects can be tolerated within the controlled bonding areas 50), and 2b-2d, for example. As necessary, the bonding surface 24 of the carrier 20 may be prepared as per the surface preparation set forth in Examples 2a (again, with the above-noted conditions) and 2b-d. The thin sheet 20 is then connected with the carrier 10 via the surface modification layer 30, which provides controlled bonding. At this stage the arrangement will appear in cross section as shown in FIG. 8, and the connection between the carrier 10 and the thin sheet 20 is one of van der Waals or hydrogen bonding at room temperature such that the carrier and sheet may be separated from one another without damage to at least the thin sheet. As shown in FIGS. 7 and 8, the bonding surface area of the carrier is the same size as the bonding surface area of thin sheet, however, such need not be the case. Instead, the surface area of the carrier may be larger than the surface area of the thin sheet, or vice versa.

The arrangement of the carrier 10, the surface modification layer 30, and the thin sheet 20 is then subjected to a process for removing a portion of the surface modification layer 30, i.e., that portion of surface modification layer 30 residing in the area in which there is desired to form a bonding area 40 including permanent covalent bonds. In the example shown in FIGS. 7-10, the desired bonding area 40 is around the perimeter of the article 2. Accordingly, the perimeter portion of the surface modification layer 30 is removed to form respective, and adjoining, exposed portions 19, 29 on the carrier 10 and thin sheet 20. The article 2 appears in cross section as shown in FIG. 9, for example. The exposed portions 19, 29 are adjoining in that they are both disposed in a position on the area of the bonding surfaces 14, 24, wherein at least a portion of each faces the other across a small gap. Although it does not appear as being the case from the figures, the exposed portions 19 and 29 are really in close proximity to one another, due to the small thickness of the surface modification layer (i.e., on the order of nanometers, typically 0.1 to 2.0 nm, up to 10 nm, and in some cases up to 100 nm).

The surface modification layer 30 may be removed by various techniques, for example, by exposing the article 2 to O2 plasma, laser radiation, UV radiation, heating, or a combination thereof. The technique used to remove a portion of the surface modification layer 30 may depend upon the material from which that layer is made. For example, a particularly effective manner of removing a surface modification layer 30 of HMDS is by O2 plasma, which oxidizes the HMDS. Other means of oxidation that work are downstream oxygen plasma, and UV-Ozone, for example. If the removal is also performed under vacuum, the oxidized HMDS is easily removed from between the carrier 10 and thin sheet 20, which may assist in forming a stronger covalent bond between the exposed portions 19, 29.

Other materials—that may be used for the controlled bonding area, and that may be removed from the perimeter, or other areas, to subsequently form bonding areas 40—include, for example: alkyl silanes; fluoro-alkyl silanes; aromatic silanes; fluoro or chloro aromatic silanes; fluorinated organics for example, Teflon, and fluoropolymers and fluorinated aromatic silanes known to produce low energy surfaces; silanes that produce trimethylsilyl or methylsilyl terminated surface such as hexamethyldisilazane, 1,1,3,3-Tetramethyldisilazane, 2,2,4,4,6,6-Hexamethylcyclotrisilazane, 1,1,3,3-Tetramethyl-1,3-diphenyldisilazane, 1,3-Dimethyl-1,1,3,3-tetraphenyldisilazane methoxytrimethylsilane, ethoxytrimethylsilane chlorotrimethylsilane, dimethoxydimethylsilane, and dichlorodmethylsilane; silanes that produce an aromatic terminated surface or fluorinated aromatic surface such as phenyltrimethoxysilane, phenyltriethoxysilane, diphenyldimethoxysilane, chlorophenyl silanes, diphenyldiethoxysilane, diphenylmethylmethoxyphenylsilane, chlorodimethyl(pentafluorophenyl)silane, pentafluorophenyltrimethoxysilane, pentafluorophenyltriethoxysilane phenyldimethylmethoxysilane and dimethylmethoxy(pentafluorophenyl)silane; silanes with one resulting silanol, bis and or tris-silanols may also work; for thermal stability, there are also some halogen substituted aromatic silanes; Diamond like carbon; fluorinated diamond like carbon; and graphene.

Because the carrier 10 and thin sheet 20 remain connected by the non-removed portion of the surface modification layer 30 throughout the removal of the portion of the surface modification layer 30 from bonding area 40, the portion of the surface modification layer in the controlled bonding area 50 is protected from contamination from any debris associated with the removal. Accordingly, there is provided a high quality controlled bonding area 50. Moreover, this technique self-aligns the exposed portions 19, 29 for covalent bonding as it removes the surface modification layer from the perimeter inward with the carrier 10 and thin sheet 20 already van der Walls or Hydrogen bonded together.

Next, the article is heated to a temperature sufficient to provide covalent bonding between the exposed portions 19, 29 to form a bonding area 40. For example, in the case of a surface modification layer according to example 2b, the article would be heated to ≥400° C., whereas in the case of a surface modification layer according to example 2c or 2d, the article would be heated to ≥600° C., wherein the practical upper limit is near the strain point of the glass in the carrier, or that in the thin sheet, whichever strain point is lower. After heating to the appropriate temperature, the article 2 will appear in cross section as shown in FIG. 10, wherein the carrier 10 and thin sheet 20 have permanently covalently bonded in the bonding area 40 so as to behave as a monolithic sheet of glass.

The desired parts 56 may then be formed on the thin sheet 20 in the controlled bonding area 50. When it is desired to remove the desired parts 56, the covalently bonded portions, i.e., the perimeter bonding area 40 may simply be sliced off of the article. The entire thin sheet remaining after removing the covalently bonded portion may then be removed from the carrier, and separated to form individual desired parts 56. Alternatively, the remaining thin sheet may be removed in two or more pieces by first separating the thin sheet into portions, and then removing each of the portions as desired.

Alternatively, to make the desired number of desired parts 56 on one article 2, there may first be made a desired number of controlled bonding areas 50 surrounded by bonded contour lines 42. See FIG. 11. The bonded contour lines 42 may be selectively formed by selectively tracing a laser in the desired shape to locally heat the surface modification layer 30 to a sufficient predetermined temperature to selectively ablate the surface modification layer to form exposed portions (similar to exposed portions 19, 29) on the carrier 10 and thin sheet 20. The carrier 10 and thin sheet 20 may then be covalently bonded to form additional bonding regions along the contour lines 42.

The article 2 may then be processed so as to form devices within the areas defined by the contour lines 42. After device processing, the desired parts 56 may be separated from the carrier 10 by any suitable manner. For example, a vent may be formed through the thickness 28 of the thin sheet 20 to form a perimeter vent 57. The perimeter vent 57 may be formed, for example, by a mechanical scribe and break process, by a laser scribe and break process, by propagation of a full body vent via laser, or by a full body laser cut. If it is desired to slide the desired parts 56 off of the carrier, or to provide an exposed edge of the parts 56 to facilitate peeling, the article 2 may first be diced into any smaller number of pieces, by dicing between appropriate ones of adjacent contour lines 42, e.g., along any pattern or sub-set of dashed lines 5. Alternatively, the article 2 may be diced along lines made so as to intersect with the perimeter vent defining the perimeter 57 of the desired part 56.

The latter method of forming the desired parts 56 within covalently bonded perimeters 42 may be advantageous in certain situations when the article 2 (thin sheet 20 together with carrier 10) is diced for further processing of devices on smaller sections, as desired.

Second Embodiment of the Third Use

According to another embodiment, a pattern of covalent bonding areas 40 and controlled bonding areas 50 may be formed by patterning the surface modification layer 30 prior to connecting the thin sheet 20 with the carrier 10 via the surface modification layer. Either additive or subtractive methods may be used.

For example, the surface modification layer 30 may be deposited onto the carrier 10 in a patterned manner so as to only be within the controlled bonding areas 50 as shown in FIG. 6 or 11. In order to deposit the surface modification layer 30 in a pattern, a mask may be used to cover the areas of the carrier bonding surface that are to form covalent bonding in areas 40. The non-masked areas then correspond to areas 50 in which there will be controlled bonding due to deposition of the surface modification layer 30 there. Other additive methods of patterning the controlled bonding area, by depositing material to form the controlled bonding area, include printing, shadow masking in vapor deposition, or inkjet printing, for example. The materials and surface treatments according to examples 2a (in situations where there will be no ultrasonic processing during device fabrication), 2c, 2d, 2e, 3a, 3b, 4b, 4c, 4d, and 4e, may be deposited on the carrier 10 to produce the desired degree of controlled bonding in areas 50.

Alternatively, the controlled bonding within areas 50 may be produced by subtractive methods. That is, the entire surface of the carrier 10 may be provided with a surface modification layer 30, and then portions of that surface modification layer 30 may then be removed to form exposed areas on the bonding surface of the carrier. For example, the surface modification layer 30 may be ablated with a laser. The exposed portions on the carrier bonding surface may then be used to covalently bond with corresponding portions of the thin sheet 20 disposed in an adjoining manner therewith. Other methods of subtractive patterning may be used, for example, photolithography and plasma etch, UV, corona discharge, or atmospheric plasma torch.

Once the surface modification layer 30 is formed within the desired configuration of controlled bonding areas 50 on the carrier 10, the thin sheet 20 is then connected to the carrier via the surface modification layer 30.

Subsequently, the article is heated to an appropriate degree to provide the desired covalent bonding in areas 40 where there is no surface modification layer 30 present between adjoining portions of the bonding surfaces of the carrier 10 and thin sheet 20. After the desired covalent bonding is formed in areas 40, the desired parts 56 may be formed on the thin sheet 20, and removed from the carrier 10 in the same manner as described above in connection with the first embodiment.

Although the surface modification layer 30 was described above as being formed on the carrier 10, it could instead be formed on the thin sheet 20. In certain situations, a surface modification layer may be used on both the thin sheet and the carrier; in such situations, as when using the material and associated surface treatment of example 2a, for example, corresponding patterns are made on each the carrier and thin sheet. The patterns may be made using the same techniques, or different techniques.

CONCLUSION

It should be emphasized that the above-described embodiments of the present invention, particularly any "preferred" embodiments, are merely possible examples of implementations, merely set forth for a clear understanding of various principles of the invention. Many variations and modifications may be made to the above-described embodiments of the invention without departing substantially from the spirit and various principles of the invention. All such modifications and variations are intended to be included herein within the scope of this disclosure and the present invention and protected by the following claims.

For example, although the surface modification layer 30 of many embodiments is shown and discussed as being formed on the carrier 10, it may instead, or in addition, be formed on the thin sheet 20. That is, the materials as set forth in the examples 4 and 3 may be applied to the carrier 10, to the thin sheet 20, or to both the carrier 10 and thin sheet 20 on faces that will be bonded together.

Further, although some surface modification layers 30 were described as controlling bonding strength so as to allow the thin sheet 20 to be removed from the carrier 10 even after processing the article 2 at temperatures of 400° C., or of 600° C., of course it is possible to process the article 2 at lower temperatures than those of the specific test the article passed and still achieve the same ability to remove the thin sheet 20 from the carrier 10 without damaging either the thin sheet 20 or the carrier 10.

Still further, although the controlled bonding concepts have been described herein as being used with a carrier and a thin sheet, in certain circumstances they are applicable to controlling bonding between thicker sheets of glass, ceramic, or glass ceramic, wherein it may be desired to detach the sheets (or portions of them) from each other.

Further yet, although the controlled bonding concepts herein have been described as being useful with glass carriers and glass thin sheets, the carrier may be made of other materials, for example, ceramic, glass ceramic, or metal. Similarly, the sheet controllably bonded to the carrier may be made of other materials, for example, ceramic or glass ceramic.

Still further yet, the article may be cleaned, using appropriate ones of the above-described cleaning methods, or others known in the art, after removing the surface modification, and prior to heating to form a permanent covalent bond. After the cleaning, the exposed portions of the thin sheet and carrier should be sufficiently dried to facilitate forming the subsequent covalent bond between the thin sheet and the carrier.

It is to be understood that various features disclosed in this specification and in the drawings can be used in any and all combinations. By way of non-limiting example the various features may be combined with one another as set forth in the following aspects:

According to a first aspect, there is provided a method of forming an article, comprising:

obtaining a glass sheet having a glass-sheet bonding surface;

obtaining a glass carrier having a carrier bonding surface;

coating at least one of the glass sheet and carrier bonding surfaces with a surface modification layer;

connecting the glass sheet with the carrier via the surface modification layer;

removing, from the perimeter of the glass sheet and the carrier while connected, a portion of the surface modification layer so as to expose a portion of the bonding surface on each of the glass sheet and the carrier, wherein the exposed portion of the glass-sheet bonding surface adjoins the exposed portion of the carrier bonding surface; and heating, after the removing and the exposing, the glass sheet and carrier at a temperature ≥400° C. but less than the strain point of both the glass of the glass sheet and the glass of the carrier so as to bond the perimeter of the glass sheet bonding surface with the perimeter of the carrier bonding surface.

According to a second aspect, there is provided the method of aspect 1, wherein the glass-sheet bonding surface has an area equal to that of the carrier bonding surface.

According to a third aspect, there is provided the method of aspect 1 or aspect 2, wherein the removing comprises, in a vacuum chamber, treating the thin sheet as connected to the carrier with an O2 plasma.

According to a fourth aspect, there is provided the method of aspect 1 or aspect 2, wherein the removing comprises using UV radiation, heat, ablation of the surface modification layer with laser energy, or combinations thereof.

According to a fifth aspect, there is provided the method of any one of aspects 1-4, further comprising cleaning at least the exposed portions of the glass sheet and the carrier after the step of removing and prior to the step of heating.

According to a sixth aspect, there is provided the method of aspect 5, further comprising drying at least the exposed portions of the glass sheet after the cleaning and prior to the heating.

According to a seventh aspect, there is provided the method of any one of aspects 1 to 6, wherein prior to coating, the at least one of the thin-sheet bonding surface and the carrier bonding surface is cleaned with one or more of the following: UV-Ozone, O2 plasma, DI-O3 water, SC1, SC2, wash chemistry including HF, or wash chemistry including H2SO4.

According to an eighth aspect, there is provided the method of any one of aspects 1 to 7, wherein the surface modification layer comprises an alkyl silane, a fluoro alkyl silane, an aromatic silane, a fluoro or chloro aromatic silane, or HMDS.

According to a ninth aspect, there is provided the method of any one of aspects 1 to 8, wherein both of the thin-sheet and carrier bonding surfaces are coated with a surface modification layer.

According to a tenth aspect, there is provided the method of any one of aspects 1 to 8, wherein only one of the thin-sheet and carrier bonding surfaces is coated with a surface modification layer, and the other one of the thin-sheet and carrier bonding surfaces is heat treated so as to reduce the hydroxyl concentration thereon to a level substantially the same as if that surface was SC1 cleaned and then heated at 450° C. for 1 hour.

According to an eleventh aspect, there is provided the method of any one of aspects 1 to 10, wherein the connecting comprises forming van der Waals bonding between the thin sheet, the carrier, and the surface modification layer.

According to a twelfth aspect, there is provided the method of any one of aspects 1 to 11, wherein the surface modification layer is 0.1 to 100 nm thick.

According to a thirteenth aspect, there is provided the method of any one of aspects 1 to 11, wherein the surface modification layer is 0.1 to 10 nm thick.

According to a fourteenth aspect, there is provided the method of any one of aspects 1 to 11, wherein the surface modification layer is 0.1 to 2 nm thick.

According to a fifteenth aspect, there is provided the method of any one of aspects 1 to 11, wherein the surface modification layer is a self-assembled monolayer.

According to a sixteenth aspect, there is provided the method of any one of aspects 1 to 15, wherein the glass sheet has a thickness of ≤300 microns.

According to a seventeenth aspect, there is provided the method of any one of aspects 1 to 16, wherein the carrier has a thickness of 200 microns to 3 mm.

According to an eighteenth aspect, there is provided an article produced by the simplified processing, specifically, there is provided a glass article comprising:

a glass sheet having a glass-sheet bonding surface;

a glass carrier having a carrier bonding surface;

a surface modification layer disposed on at least one of the glass-sheet bonding surface and the carrier bonding surface;

wherein the glass sheet and carrier are connected via the surface modification layer, wherein a perimeter of the glass-sheet bonding surface is affixed to the carrier, whereby the glass sheet and carrier act as a monolith at the affixed perimeter.

According to a nineteenth aspect, there is provided the glass article of aspect 18, wherein a perimeter of the carrier bonding surface remains uncoated by the surface modification layer, wherein a perimeter of the glass-sheet bonding surface remains uncoated by the surface modification layer, and wherein the uncoated perimeter of the carrier bonding surface is affixed to the uncoated perimeter of the glass-sheet bonding surface.

According to a twentieth aspect, there is provided the glass article of aspect 18 or aspect 19, wherein the surface modification layer comprises an alkyl silane, a fluoro alkyl silane, an aromatic silane, or a fluoro or chloro aromatic silane.

According to a twenty first aspect, there is provided the article of aspect 18 or aspect 19, wherein the surface modification layer comprises HMDS.

According to a twenty second aspect, there is provided the article of any one of aspects 18 to 21, wherein the surface modification layer is 0.1 to 100.0 nm thick.

According to a twenty third aspect, there is provided the method of any one of aspects 18 to 21, wherein the surface modification layer is 0.1 to 10.0 nm thick.

According to a twenty fourth aspect, there is provided the method of any one of aspects 18 to 21, wherein the surface modification layer is 0.1 to 2.0 nm thick.

According to a twenty fifth aspect, there is provided the method of any one of aspects 18 to 21, wherein the surface modification layer is a self-assembled monolayer.

According to a twenty sixth aspect, there is provided the article of any one of aspects 18 to 25, wherein a surface modification layer is disposed on each of the glass sheet and carrier, and further wherein the material of the glass-sheet surface modification layer is the same as that of the carrier surface modification layer.

According to a twenty seventh aspect, there is provided the article of any one of aspects 18 to 26, wherein the glass sheet has a thickness of ≤300 microns.

According to a twenty eighth aspect, there is provided the article of any one of aspects 18 to 27, wherein the carrier has a thickness of 200 microns to 3 mm.

What is claimed is:

1. A method of forming an article, comprising:
    obtaining a glass sheet having a glass-sheet bonding surface with a perimeter;
    obtaining a glass carrier having a carrier bonding surface with a perimeter;
    coating at least one of the glass sheet and carrier bonding surfaces with a surface modification layer;
    connecting the glass sheet with the carrier via the surface modification layer;
    removing, from the perimeter of the glass sheet and the carrier while connected, a portion of the surface modification layer so as to expose a portion of the bonding surface on each of the glass sheet and the carrier, wherein the exposed portion of the glass-sheet bonding surface adjoins the exposed portion of the carrier bonding surface; and
    heating, after the removing and the exposing, the glass sheet and carrier at a temperature $\geq 400°$ C. but less than the strain point of both the glass of the glass sheet and the glass of the carrier so as to bond the perimeter of the glass sheet bonding surface with the perimeter of the carrier bonding surface.

2. The method of claim 1, wherein the glass-sheet bonding surface has an area equal to that of the carrier bonding surface.

3. The method of claim 1, wherein the removing comprises, in a vacuum chamber, treating the glass sheet as connected to the carrier with an O2 plasma.

4. The method of claim 1, wherein the removing comprises using UV radiation, heat, ablation of the surface modification layer with laser energy, or combinations thereof.

5. The method of claim 1, wherein prior to coating, the at least one of the glass-sheet bonding surface and the carrier bonding surface is cleaned with one or more of the following: UV-Ozone, Oxygen plasma, ozonated deionized water (DI-$O_3$), standard clean 1 (SC1), standard clean 2 (SC2), wash chemistry including hydrogen fluoride (HF), or wash chemistry including sulfuric acid ($H_2SO_4$).

6. The method of claim 1, wherein the surface modification layer comprises an alkyl silane, a fluoro alkyl silane, an aromatic silane, a fluoro or chloro aromatic silane, or hexamethyldisilazane (HMDS).

7. The method of claim 1, wherein both of the glass-sheet and carrier bonding surfaces are coated with a surface modification layer.

8. The method of claim 1, wherein only one of the glass-sheet and carrier bonding surfaces is coated with a surface modification layer, and the other one of the glass-sheet and carrier bonding surfaces is heat treated so as to reduce the hydroxyl concentration thereon to a level substantially equal to a hydroxyl concentration on a glass surface that was cleaned with a standard clean 1 and then heated at 450° C. for 1 hour.

9. The method of claim 1, wherein the surface modification layer is 0.1 to 100 nm thick.

10. The method of claim 1, wherein the surface modification layer is a self-assembled monolayer.

11. The method of claim 1, wherein the glass sheet has a thickness of $\leq 300$ microns.

12. The method of claim 1, wherein the carrier has a thickness of 200 microns to 3 mm.

* * * * *

UNITED STATES PATENT AND TRADEMARK OFFICE
CERTIFICATE OF CORRECTION

PATENT NO.       : 9,889,635 B2
APPLICATION NO.  : 14/651720
DATED            : February 13, 2018
INVENTOR(S)      : Robert Alan Bellman et al.

It is certified that error appears in the above-identified patent and that said Letters Patent is hereby corrected as shown below:

On the Title Page

Item (72), add inventors Theresa Chang, Painted Post, NY; Jeffrey John Domey, Elmira, NY; Vasudha Ravichandran, Painted Post, NY; Alan Thomas Stephens II, Beaver Dams, NY; and John Christopher Thomas, Elmira, NY.

On page 4, Column 1, item (56), other publications, Line 10, delete "Sllcia" and insert -- Silica --, therefor.

On page 4, Column 1, item (56), other publications, Line 11, delete "Chemistryof" and insert -- Chemistry of --, therefor.

On page 4, Column 1, item (56), other publications, Line 23, delete "1994,IO," and insert -- 1994, 10, --, therefor.

On page 4, Column 1, item (56), other publications, Line 44, delete "Ehanced" and insert -- Enhanced --, therefor.

On page 4, Column 1, item (56), other publications, Line 55, delete "Periluoroelastomers" and insert -- Perfluoroelastomers --, therefor.

On page 4, Column 2, item (56), other publications, Line 1, delete "perflurorelastomer" and insert -- perfluoroelastomer --, therefor.

On page 4, Column 2, item (56), other publications, Line 63, delete "Irfrared" and insert -- Infrared --, therefor.

Signed and Sealed this
Tenth Day of December, 2019

Andrei Iancu
*Director of the United States Patent and Trademark Office*